(12) United States Patent
Hwangbo et al.

(10) Patent No.: US 10,756,416 B2
(45) Date of Patent: Aug. 25, 2020

(54) GLASS INTERPOSER INTEGRATED ANTENNA FOR INTRACHIP, INTERCHIP AND BOARD COMMUNICATIONS

(71) Applicant: University of Florida Research Foundation, Inc., Gainesville, FL (US)

(72) Inventors: Seahee Hwangbo, Gainesville, FL (US); Yong Kyu Yoon, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 84 days.

(21) Appl. No.: 16/164,536

(22) Filed: Oct. 18, 2018

(65) Prior Publication Data

US 2019/0051972 A1   Feb. 14, 2019

(51) Int. Cl.
*H01Q 1/32*   (2006.01)
*H01Q 1/22*   (2006.01)
(Continued)

(52) U.S. Cl.
CPC ......... *H01Q 1/2283* (2013.01); *H01L 23/492* (2013.01); *H01L 23/49811* (2013.01); *H01L 23/66* (2013.01); *H01Q 1/32* (2013.01); *H01Q 9/0407* (2013.01); *H01Q 9/285* (2013.01); *H01Q 9/30* (2013.01); *H01Q 9/36* (2013.01); *H01Q 13/106* (2013.01); *H01Q 15/14* (2013.01)

(58) Field of Classification Search
CPC ...... H01Q 1/2283; H01Q 1/32; H01Q 9/0407; H01Q 9/285; H01Q 9/30; H01Q 9/36; H01Q 13/106; H01Q 15/14
See application file for complete search history.

(56) References Cited

U.S. PATENT DOCUMENTS 6,324,313 B1   11/2001   Allman et al.
2010/0188309 A1   7/2010   Orime et al.
(Continued)

FOREIGN PATENT DOCUMENTS

WO   2015183915 A1   12/2015

OTHER PUBLICATIONS

International Search Report for PCT/US2017/028054 dated Oct. 12, 2017.
(Continued)

*Primary Examiner* — Graham P Smith
(74) *Attorney, Agent, or Firm* — Thomas Horstemeyer, LLP

(57) ABSTRACT

Various examples are provided for glass interposer integrated antennas for intrachip, interchip and board communications. In one example, a reflector through-glass via (TGV) antenna includes a TGV or group of TGVs extending through a glass substrate. The TGV can extend from a feeding line disposed on a first side of the glass substrate to a loading disc disposed on a second side of the glass substrate. An array of reflector pillars extending through the glass substrate from a ground plane on the first side of the glass substrate to the second side of the glass substrate can also be provided with the array of reflector pillars distributed beyond an outer edge of the loading disc. The TGV antenna can be implemented as a dual mode design and excited at a first frequency to generate an omni-directional radiation pattern and at a second frequency to generate a broadside radiation pattern.

16 Claims, 28 Drawing Sheets

(51) Int. Cl.
*H01Q 9/36* (2006.01)
*H01Q 9/28* (2006.01)
*H01Q 9/30* (2006.01)
*H01L 23/492* (2006.01)
*H01L 23/498* (2006.01)
*H01L 23/66* (2006.01)
*H01Q 9/04* (2006.01)
*H01Q 13/10* (2006.01)
*H01Q 15/14* (2006.01)

(56) References Cited

U.S. PATENT DOCUMENTS

2011/0234467 A1    9/2011   Huang et al.
2012/0154238 A1    6/2012   Carpentier et al.
2015/0288052 A1   10/2015   Liu et al.

OTHER PUBLICATIONS

John H. Lau, "3D IC Packaging 3D IC Integration," CPMT Distinguish Lecture, San Diego Chapter, Feb. 23, 2015.

Takamaro Kikkawa, "Wireless inter-chip interconnects,", Microelectronic Engineering, vol. 88, No. 5, May 2011, pp. 767-774.

L. Dussopt, Joblot, S., Lanteri, J., Salti, H., Bar, P., Sibuet, H., Reig, B., Carpentier, J-F., Dehos, C., Vincent, P, "Silicon Interposer with Integrated Antenna Array for Millimeter-Wave Short-Range Communications", Microwave Symposium Digest (MTT), 2012 IEEE MTT-S International, Jun. 17-22, 2012.

Julia Hsin-Lin Lu, Wing-Fai Loke, Dimitrios Peroulis, and Byunghoo Jung, "Implementing Wireless Communication Links in 3-D ICs Utilizing Wide-Band On-Chip Meandering Micro-bump Antenna", 3D Systems Integration Conference (3DIC), 2013 IEEE International, Oct. 2-4, 2013.

| Type | TGV | Disc-loading |
|---|---|---|
| Omni-directional TGV antenna for in-plane comm. | Monopole antenna | Antenna efficiency and impedance matching |
| Patch-type TGV antenna for out-of-plane comm. | Vertical feeding line | Patch antenna |
| Dual-band TGV antenna for both in-/out-of-plane comm. | Both monopole/patch antennas can be achieved by adjusting the impedance of feeding line. | |

|  | Simulated | Measured |
|---|---|---|
| Return loss | 32.32 dB @ 83.33GHz | 20.88 @ 84.8 GHz |
| 10dB Bandwidth | 29.23 % (78.08 GHz – 102.44 GHz) | 31.3 % (80.89 GHz – 107.06 GHz) |

82 GHz

96 GHz

| Parameters | Simulated Results |
|---|---|
| Efficiency | 95.86 % |
| Peak gain | 3.14 dBi |
| Front-to-back ratio | 6.9 |

| Antenna type | | Resonant frequency | 10dB Bandwidth | Radiation Pattern | Antenna gain | Antenna efficiency |
|---|---|---|---|---|---|---|
| Intra-chip Comm. 300b | Omni-directional | 77 GHz | 12.4 % (72.9 GHz – 82.5 GHz) | Omni-directional | 2.13 dBi | 95 % |
| Inter-chip Comm. 300c | Broadside | 83.33 GHz | 29.23 % (78.08 GHz – 102.44 GHz) | Broadside | 3.14 dBi | 95.86 % |
| Both intra-/inter-chip Comm. 300e | Dual-band | 62 GHz | 6.61 % (60.1 GHz – 64.2 GHz) | Broadside | 5.36 dBi | 93.3 % |
| | | 77 GHz | 13.3 % (73.2 GHz – 82.7 GHz) | Omni-directional | 4.1 dBi | 97 % |

FIG. 3Q

GLASS INTERPOSER INTEGRATED ANTENNA FOR INTRACHIP, INTERCHIP AND BOARD COMMUNICATIONS

CROSS REFERENCE TO RELATED APPLICATIONS

This application claims priority to, and the benefit of, co-pending PCT application No. PCT/US2017/028054, filed Apr. 18, 2017, which claims priority to, and the benefit of, U.S. provisional application entitled "Glass Interposer Integrated Antenna for Intrachip, Interchip and Board Communications" having Ser. No. 62/323,966, filed Apr. 18, 2016, both of which are hereby incorporated by reference in their entireties.

BACKGROUND

Conventional wired interconnect technologies for data transmission in three-dimensional integrated circuits (3D-ICs) include mechanical contacts such as wire bonding and through silicon vias (TSVs). These wired interconnect technologies can allow for a smaller form factor, lower power consumption, wider bandwidths, and better performance. However, the processes are expensive and can pose reliability issues. In addition, cross talk and delay can be caused by neighboring lines in proximity and mechanical contacts. Scaling limits also exist (e.g., about 10 µm pitch) because of the mechanical contact size, and the bonded connections can be difficult to test in fine pitch.

SUMMARY

Embodiments of the present disclosure are related to glass interposer integrated antennas for intrachip, interchip and board communications.

In one aspect, among others, a through-glass via (TGV) antenna, comprises a TGV extending through a glass substrate, the TGV comprising a metal core extending from a feeding line disposed on a first side of the glass substrate to a loading disc disposed on a second side of the glass substrate. In one or more aspects, the TGV antenna can further comprise an array of reflector pillars extending through the glass substrate from a ground plane on the first side of the glass substrate to the second side of the glass substrate, the array of reflector pillars distributed beyond an outer edge of the loading disc. The array of reflector pillars can be distributed about the outer edge of the loading disc. The array of reflector pillars can be distributed in a semi-circular (or parabolic) pattern about the outer edge of the loading disc. The array of reflector pillars can be evenly spaced about the outer edge of the loading disc. Adjacent pillars of the array of reflector pillars can be separated by a distance less than a diameter of the adjacent pillars. Individual pillars of the array of reflector pillars have a diameter of about 0.1 mm. The TGV can have a diameter of about 0.342 mm and the loading-disc can have a diameter of about 1.064 mm.

In one or more aspects, the TGV antenna can further comprise a group (or array) of TGVs extending through the glass substrate between the feeding line and the loading disc, the group of TGVs evenly distributed in a circular pattern. In one or more aspects, a three-dimensional integrated circuit (3D-IC) can comprise a TGV antenna including one or more aspects. The TGV antenna can be configured for intra-chip communications and/or inter-chip communications with a second 3D-IC. The 3D-IC can comprise an array of reflector TGV antennas aligned along a side of the 3D-IC, the array of reflector TGV antennas configured to direct inter-chip communications to the second 3D-IC.

In another aspect, a method, comprises exciting a dual mode through-glass via (TGV) antenna at a first frequency, the dual mode TGV comprising a TGV extending through a glass substrate, the TGV comprising a metal core extending from a feeding line disposed on a first side of the glass substrate to a loading disc disposed on a second side of the glass substrate, the excitation at the first frequency generating an omni-directional radiation pattern about the dual mode TGV antenna; and exciting the dual mode TGV antenna at a second frequency, the excitation at the second frequency generating a broadside radiation pattern extending outward along an axial length of the dual mode TGV antenna. In one or more aspects, the dual mode TGV antenna can be simultaneously excited at the first and second frequencies. The glass substrate can be a glass interposer in a three-dimensional integrated circuit (3D-IC). The dual mode TGV antenna can laterally transmit a first set of data within the 3D-IC at the first frequency and can vertically transmit a second set of data within the 3D-IC at the second frequency. The dual mode TGV antenna can comprise a group (or array) of TGVs extending through the glass substrate between the feeding line and the loading disc, the group of TGVs evenly distributed in a circular pattern.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 3Q includes a table comparing operational characteristics of the omni-directional, patch-type and dual mode TGV antennas of FIGS. 3D, 3G and 3K, in accordance with various embodiments of the present disclosure.

DETAILED DESCRIPTION

Figure 1A:
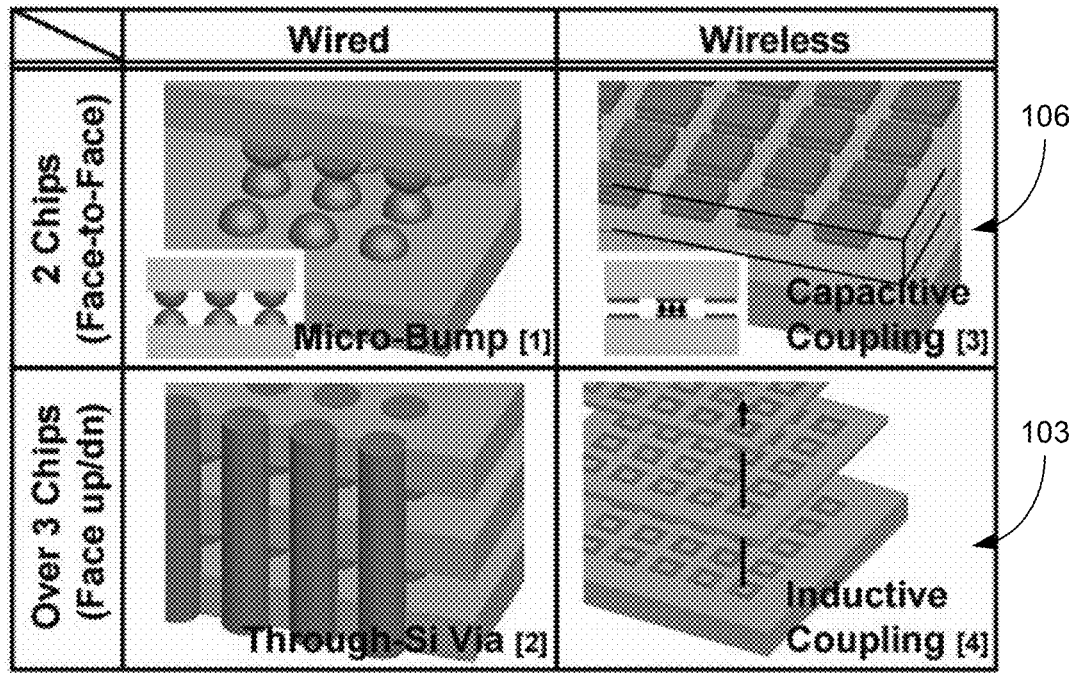
FIGS. 1A through 1G illustrate examples of intra-chip, inter-chip and board communications exercised by others, in accordance with various embodiments of the present disclosure.

Disclosed herein are various embodiments of methods related to glass interposer integrated antennas that can be used for intrachip, interchip and board communications. Reference will now be made in detail to the description of the embodiments as illustrated in the drawings, wherein like reference numbers indicate like parts throughout the several views.

Conventional wireless interconnect technologies for data transmission in three-dimensional integrated circuits (3D-ICs) utilize inductive/capacitive (LC) coupling or electromagnetic (EM) waves to minimize cross talk and delay caused by mechanical contacts such as wire bonding and through silicon vias (TSVs). FIG. 1A illustrates examples of inductive coupling 103 and capacitive coupling 106 for wireless interconnection between chips and/or boards. Two plate capacitors and/or spiral inductors may be used to realize LC coupling between chips, but the communication distance using this type of LC coupling is limited to only two or three chips due to its near-field communication properties.

Figure 1B:
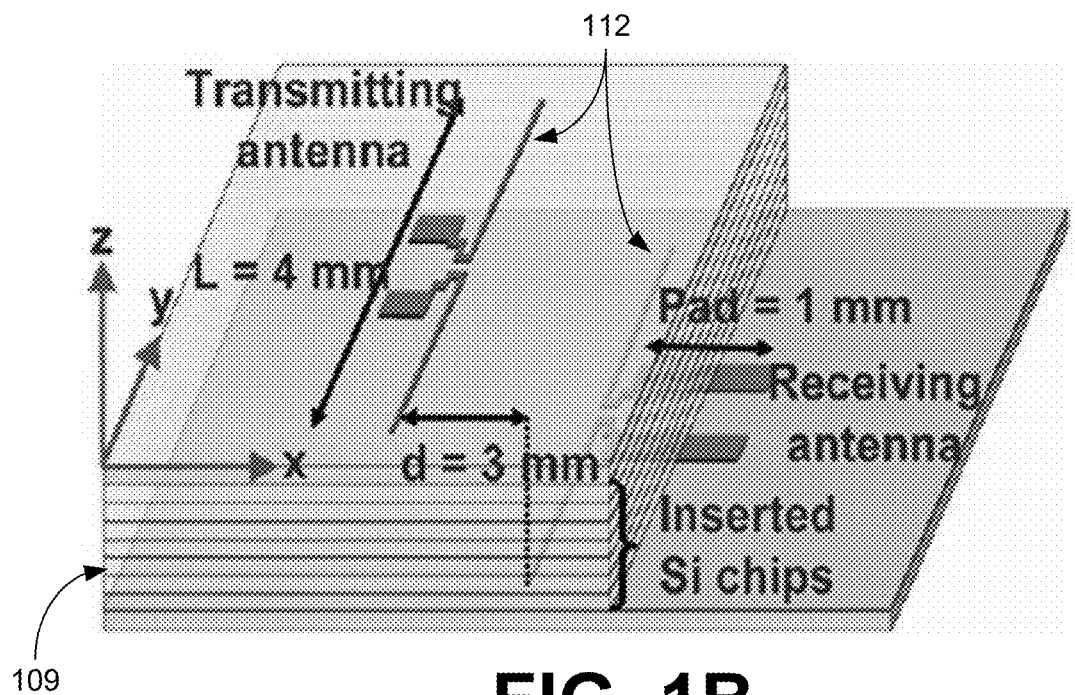
Figure 1C:
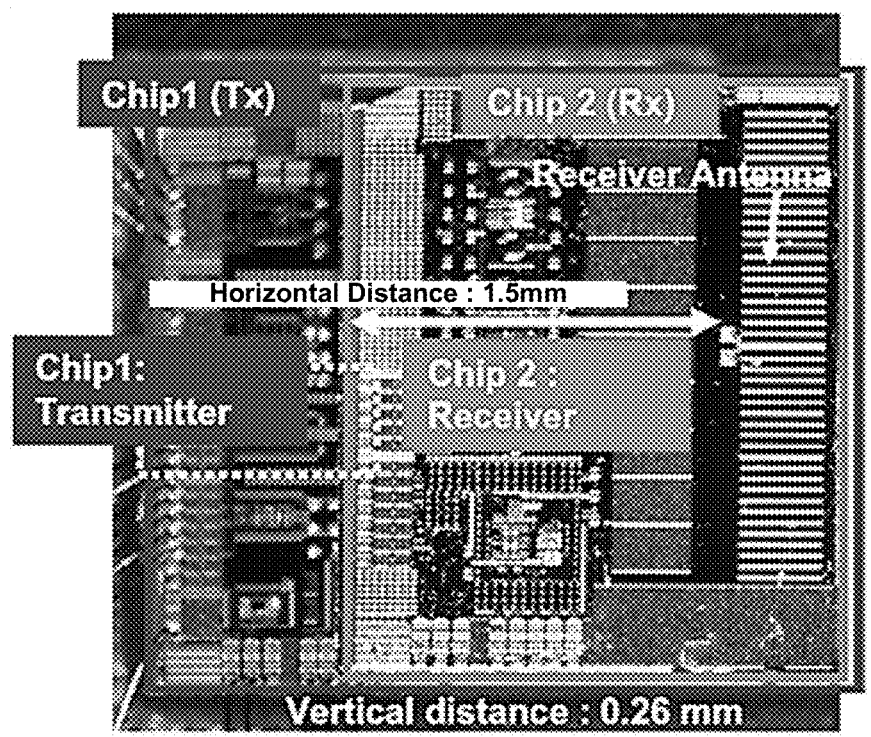
Figure 1D:
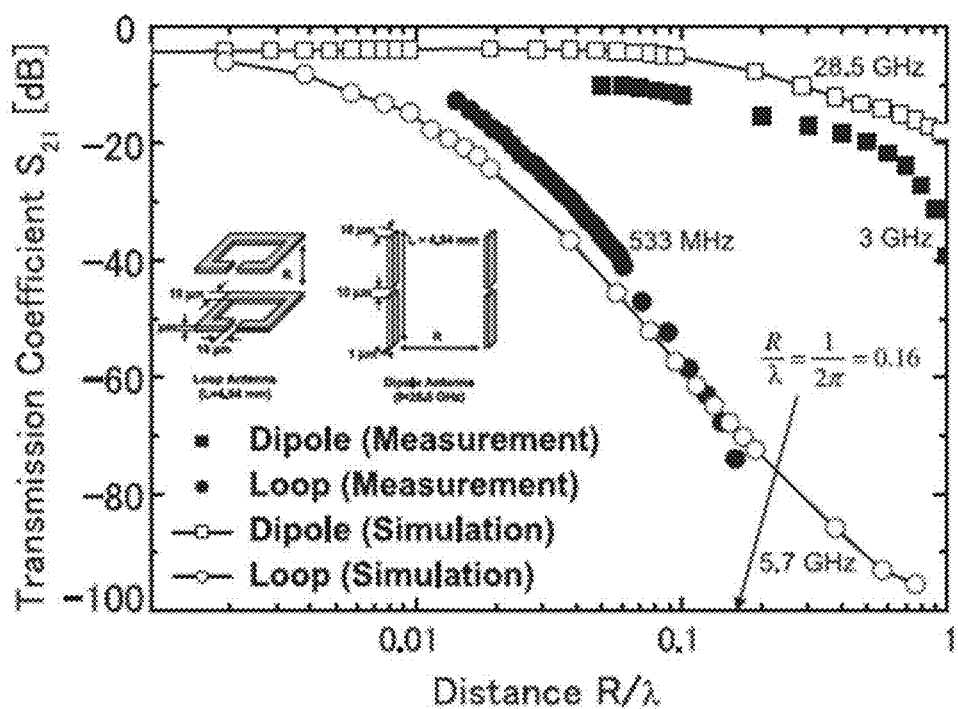

In order to increase the communication distance, an antenna may be used on a silicon interposer (or Si chip) 109 to achieve far-field communications at distances of 10 chips or more. FIG. 1B illustrates an example of the use of dipole antennas 112 separated by Si chips 109 for wireless interconnection between chips and/or boards. FIG. 1C is an image of two chips (Chip1 and Chip2) that are configured to wirelessly communicate via dipole antennas. FIG. 1D is a plot comparing measured and simulated transmission characteristics of inductive coupling via loops and dipole antenna operation. Dipole antennas 112 designed on silicon interposers have shown lower antenna gain and efficiency in the high frequency range due to low signal isolation and the high dielectric constant of the silicon interposer layer 109. Further discussion of the use of LC coupling and dipole antennas for wireless inter-chip communication is provided in "Wireless inter-chip interconnects" by Takamaro Kikkawa (*Microelectronic Engineering*, vol. 88, no. 5, May 2011, Pages 767-774), which is hereby incorporated by reference in its entirety.

Figure 1E:
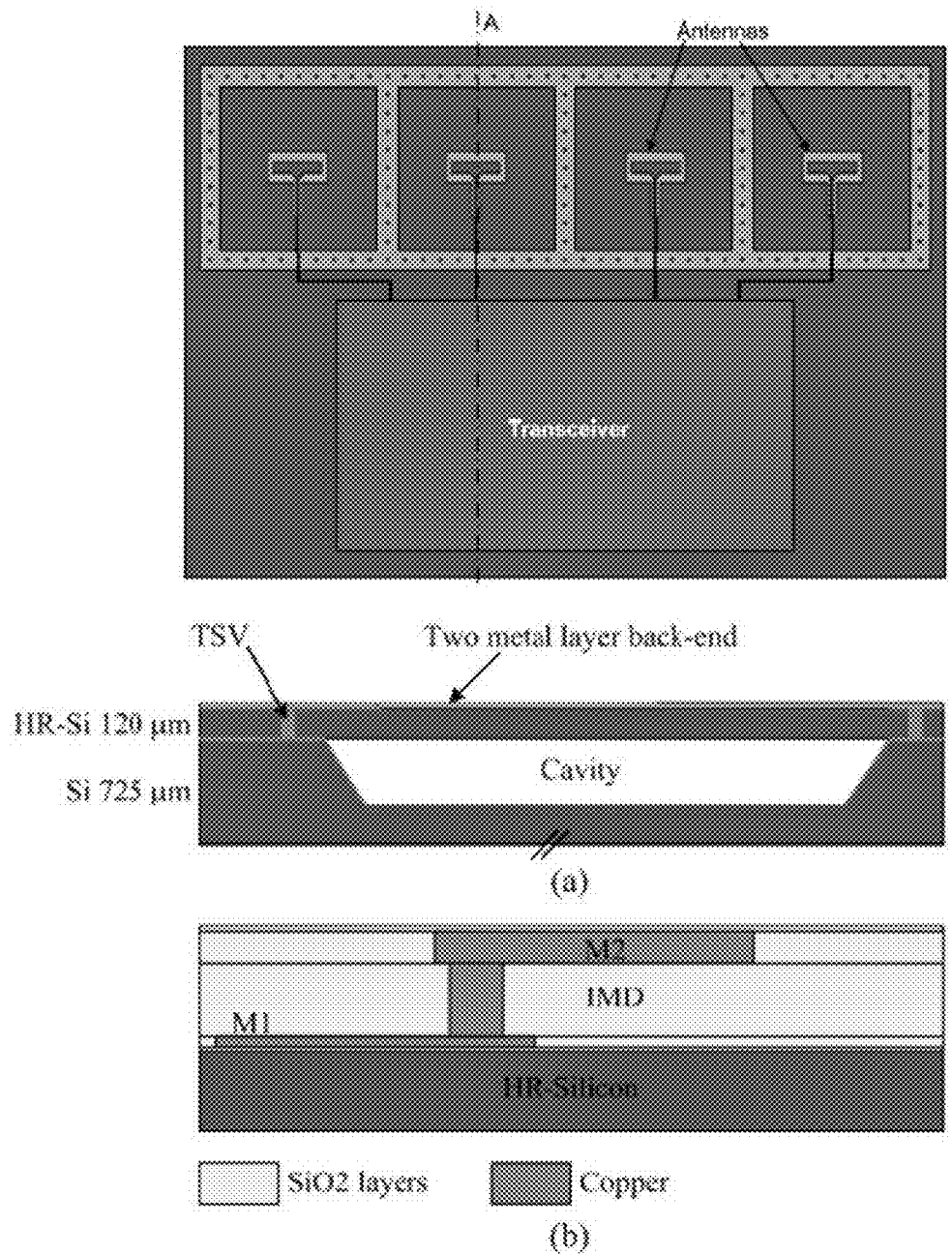

An antenna array can also be integrated into the Si interposer to provide a wireless interconnect. FIG. 1E shows top and cross-sectional views of a transceiver module using a cavity backed antenna array. The first cross-sectional view (a) illustrates the cavity in the Si interposer behind the antennas, and the second cross-sectional view (b) illustrates the two-metal back-end on the top of the substrate. When implemented, the antenna array exhibited a large footprint (e.g., 8.8 mm×2.2 mm), which can limit its usability. Further discussion of the use of antenna arrays for wireless communication is provided in "Silicon Interposer with Integrated Antenna Array for Millimeter-Wave Short-Range Communications" by L. Dussopt et al. (*Microwave Symposium Digest (MTT)*, 2012 IEEE MTT-S International, June 2012), which is hereby incorporated by reference in its entirety.

Figure 1F:
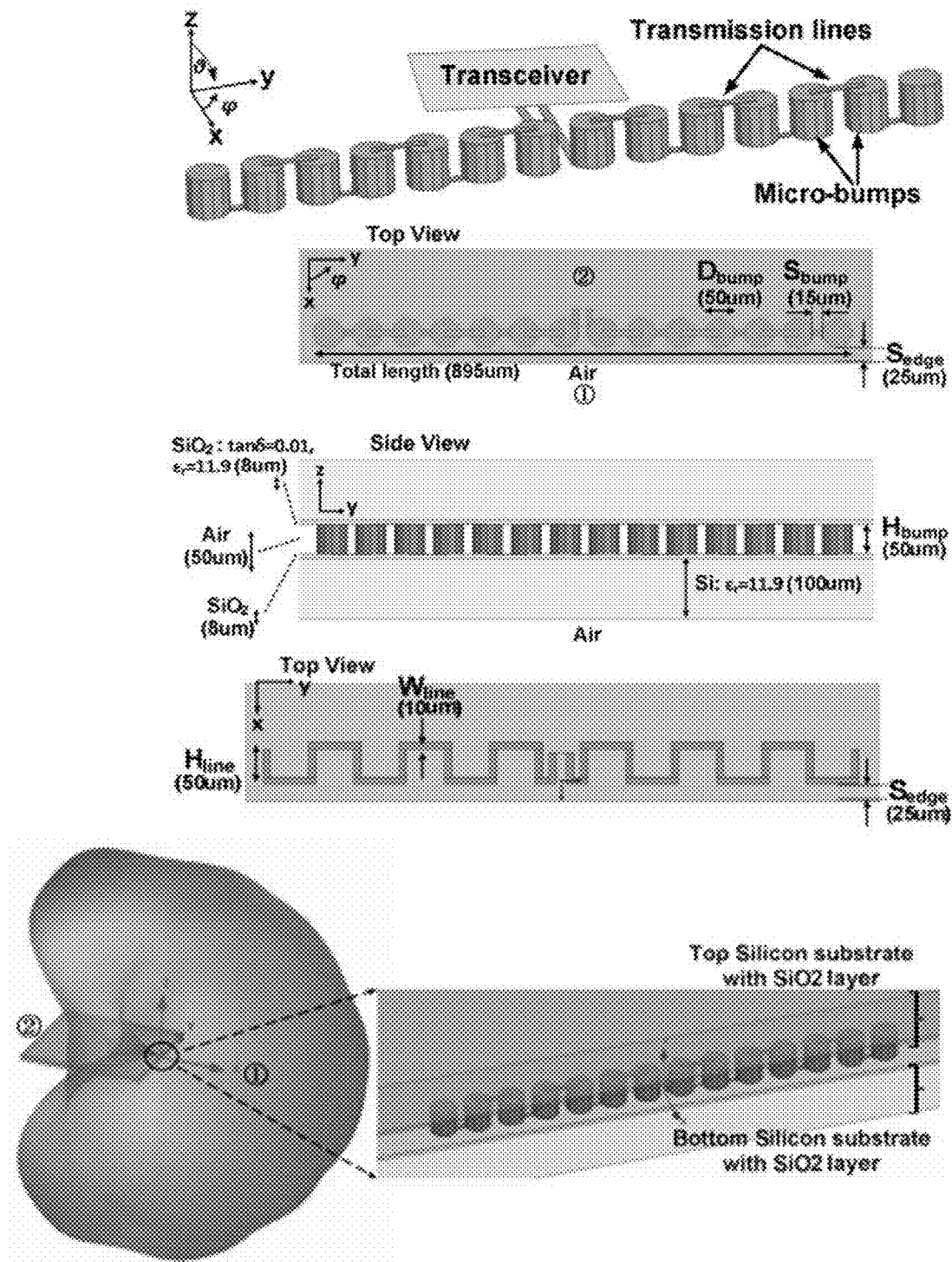

Meandering micro-bump antennas can also be used for communications between stacks. FIG. 1F shows perspective, top and side views of an example of a meandering micro-bump antenna, which includes two series micro-bumps extending in opposite directions from a center transceiver connection. The micro-bumps are coupled together by interconnecting leads that alternate between the top and bottom of the micro-bumps. When positioned between Si interposers, as illustrated in the bottom view of FIG. 1F, the meandering micro-bump antenna acts as a cavity-backed antenna array. Further discussion of the use of meandering micro-bump antennas for wireless communication is provided in "Implementing Wireless Communication Links in 3-D ICs Utilizing Wide-Band On-Chip Meandering Micro-bump Antenna" by Julia Hsin-Lin Lu et al. (*3D Systems Integration Conference (3DIC)*, 2013 IEEE International, October 2013), which is hereby incorporated by reference in its entirety.

Figure 1G:
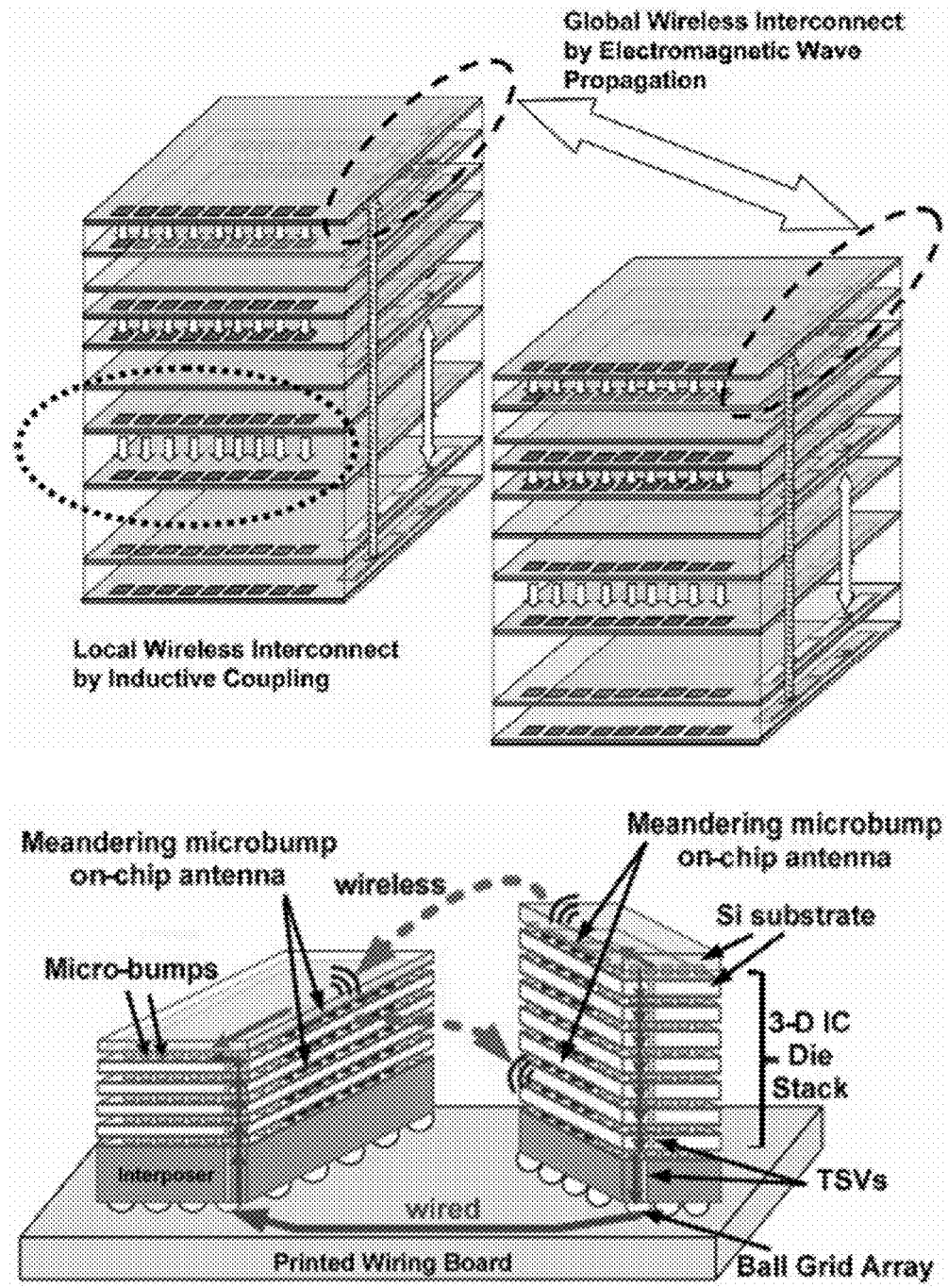

As illustrated in FIG. 1G, it is possible to achieve local wireless interconnection within a 3D-IC using LC coupling and/or antennas, and to achieve global wireless interconnection between 3D-ICs using antennas. However, unlike these conventional wireless interconnects, glass interposer integrated antennas can not only enable far-field communications over longer distances (intra-chip/inter-chip and board data transmission), but can also achieve high antenna gain, efficiency and directionality.

Both wireless intra-chip and inter-chip communications in 3D-ICs can be achieved using glass interposer integrated through-glass via (TGV) disc loaded antennas. Glass interposers offer a promising alternative to silicon interposers because of their high signal isolation, low dielectric loss and low manufacturing cost. The glass can be used as a wave propagation medium for signal transmission. Glass interposers exhibit significant advantages such as high signal isolation and low dielectric constant ($\varepsilon_r$=~5) and loss tangent (tan $\delta$=0.0036) over that of silicon interposers ($\varepsilon_r$=~11 and typically tan $\delta$>0.01). For example, a glass substrate from Corning Inc. with a thickness of 300 µm offers $\varepsilon_r$=5.53 and tan $\delta$=0.0036. TGVs may be processed by laser drilling, and wet and drying etching can be used for 3D packaging instead of TSV.

Figures 2A, 2B:
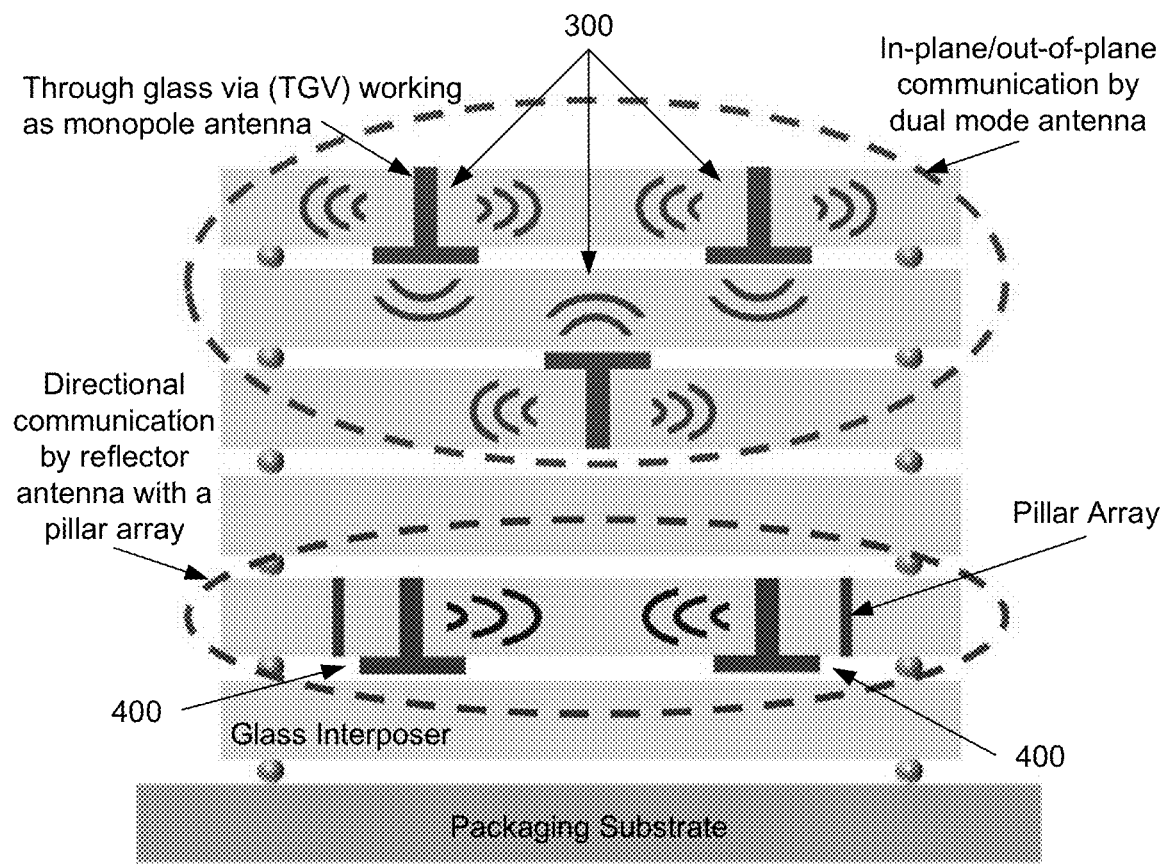
FIGS. 2A and 2B illustrate an example of intra-chip and inter-chip communications using glass interposer integrated antennas, in accordance with various embodiments of the present disclosure.

Use of glass interposer integrated antennas can eliminate cross talks and RC delay caused by extra wire bonding and TSVs, which can enable reduction in the IC footprint, reduction in the power consumption, and realization of high-speed data transmissions in 3D-IC. Glass integrated antennas provide better antenna performance than the silicon integrated ones as glass has higher signal isolation, low dielectric loss and low manufacturing cost compared to silicon in RF applications. FIGS. 2A and 2B illustrate the use of glass interposer integrated antennas in 3D-ICs for intra-chip and inter-chip communications. FIG. 2A includes a table illustrating three types of glass integrated antennas: omni-directional TGV antennas for in-plane communications, patch type TGV antennas for out-of-plane communications, and dual band or mode TGV antennas for both in-plane and/or out of plane communications. As shown in FIG. 2B, both lateral in-plane and vertical out-of-plane communications can be achieved at different frequencies using dual mode TGV antennas, which can serve as both a monopole antenna and a patch antenna. In addition, point-to-point communications in lateral directions can be enabled by utilizing a reflector antenna with a pillar array for directional control as shown in FIG. 2B. Lower substrate loss, higher signal isolation, and lower manufacturing cost in RF applications can be achieved by replacing silicon interposers with glass interposers.

The dual mode TGV antennas can operate in an omnidirectional radiation mode at a first frequency and a vertical directional radiation mode at a second frequency. In-plane (lateral) communication can be achieved by utilizing a TGV as a monopole antenna, and a circular-shaped loading disc located at the tip of the TGV to improve the efficiency and matching of the electrically small TGV monopole antenna associated with the thin thickness of glass substrate. The combination of the TGV monopole antenna and the disc forms a disc-loaded monopole antenna whose radiation pattern is omni-directional appropriate for (lateral) in-plane communications. Also, out-of-plane (vertical) communications can be obtained by allowing the disc to behave as a patch antenna and the TGV to act as a feeding line, producing a vertical broadside radiation pattern. The resulting vertical radiation pattern is appropriate for out-of-plane communications. When properly designed, both in-plane and out-of-plane communications can be achieved using a single dual mode TGV antenna, where the TGV and disc work as the monopole antenna at the first frequency and the patch antenna at the second frequency.

The reflector TGV antenna uses the TGV and disc-loading to produce omni-directional radiation and a pillar array for directionality of the transmitted electromagnetic (EM) waves. The reflector TGV antenna for point-to-point communications comprises the disc-loaded TGV monopole antenna made up the TGV and the disc with the pillar array on one side connected to the ground plane. The pillar array works as a reflector so that the omni-directional radiation pattern produced by the disc-loaded TGV monopole antenna becomes a directional radiation pattern as the EM waves propagating towards the pillar array are reflected back in the opposite side, resulting in a directional radiation pattern. The distribution of the pillars may be adjusted based on the desired radiation pattern.

The present disclosure examines an example of a dual mode TGV antenna with omni-directional radiation at 77 GHz and vertical directional radiation at 62 GHz. The 62 GHz (WiGig)/77 GHz (W-band) glass interposer integrated dual-mode TGV antenna can be used for wireless interconnects that can facilitate high-speed wireless data transmission and clock synchronization in 3D-ICs. This disclosure also examines an example of a reflector TGV antenna with a directional radiation pattern at 77 GHz. The configuration of the pillar array can affect the direction and/or width of the radiation pattern. For example, the distance of the pillars from the TGV and/or the amount of encirclement of the TGV by the pillars can dictate the directionality of the transmitted EM radiation. In addition, a phased array of reflector TGV antennas can be used to actively control and/or adjust the direction of transmissions from the array.

Figure 3A:
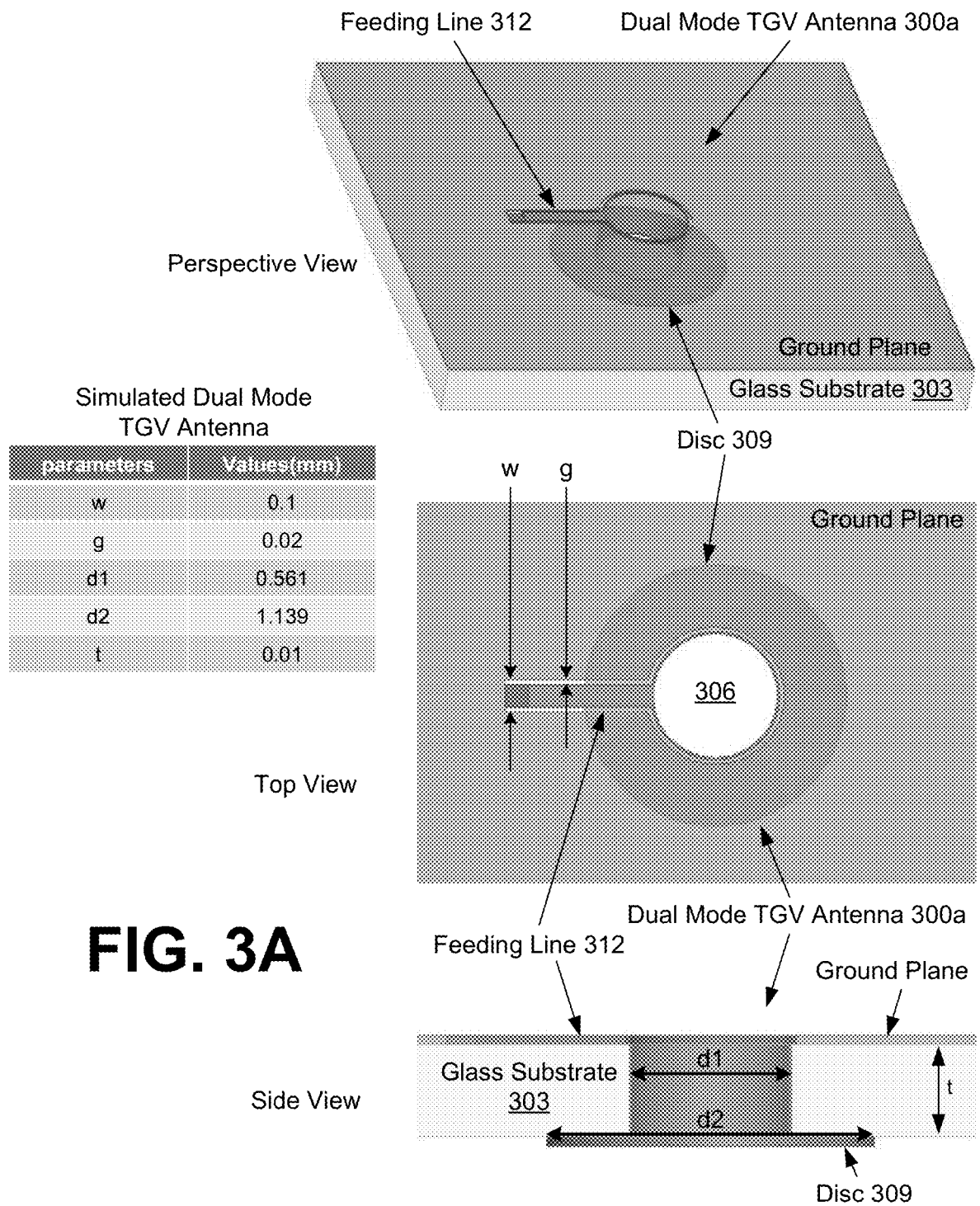
FIGS. 3A through 3C illustrate an example of a dual mode through-glass via (TGV) antenna and simulation results, in accordance with various embodiments of the present disclosure.

Referring to FIG. 3A, shown are perspective, top and side views of an example of a dual mode TGV antenna 300a on a glass interposer layer 303. The TGV 306 loaded with a circular disc 309 can be integrated on the glass interposer layer 303 for millimeter-wave wireless communication applications. The TGV 306 can be used as the main radiator and the circular disc 309 can be used for impedance matching. An omnidirectional radiation pattern formed by the monopole antenna allows in-plane wireless communication, which can solve problems such as cross talk and time delay caused by the conventional wire bonding approach.

When the thickness of glass substrate 303 is smaller than a quarter wavelength, the TGV 306 becomes a vertical electrically short monopole antenna, resulting in less current on the antenna 300a compared to the current on a quarter wavelength monopole antenna. A capacitive disc 309 can be loaded at the tip of the TGV 306 integrated on a glass substrate 303 to increase the current and radiation resistance of the antenna 300a, allowing the antenna 300a to radiate more power. As a circular disk is loaded at the tip of an electrically short monopole antenna, the current flows in the disc, increasing the current and the radiated power in the electrically short monopole antenna and improving the antenna efficiency. Therefore, the dual mode TGV antenna 300a can be integrated in any thickness of glass substrate 303 while still exhibiting good performance.

FIG. 3A illustrates the geometry of an example of the dual mode TGV antenna 300a. In the example, the antenna 300a was designed on a glass substrate 303 with a relative electrical permittivity $\varepsilon_r$ of 5.53, a loss tangent tan $\delta$ of 0.0036, and a thickness (t) of 300 μm. The capacitive disc 309 is loaded at the tip of the TGV 306 to make the antenna more efficient. In the example, the diameter (d1) of the TGV 306 working as the antenna 300a is 561 μm and a diameter (d2) of the disc 309 is 1.139 mm. A coplanar waveguide (CPW) feeding line 312 is used to excite the antenna 300a. Dimensions of the CPW feeding line 312 are w=0.1 mm and g=0.02 mm. The dual mode TGV antenna 300a was designed and simulated using the HFSS (ANSYS Inc.).

An example of the fabrication of a dual mode TGV antenna 300a will now be discussed. To begin, a glass substrate 303 processed by fusion forming by Corning Inc. can be provided. The fusion formed glass substrate 303 is thin and strong and has high quality of pristine surface. The micro fabrication of the antenna 300a on the glass substrate 303 can be divided into two processing stages: (1) the front side of the glass substrate 303 and via fabrication processing for the CPW feeding line 312 and TGV 306; and (2) the back side of the glass substrate fabrication process for a circular disc 309. The TGV 306 can be formed in the glass substrate 303 using several techniques such as, e.g., mechanical (drill), chemical (wet chemical and plasma), electrical discharge and/or laser drilling. In order to fabricate the feeding line 312 and TGV 306, a seed layer (e.g., titanium (Ti)/copper (Cu)/titanium (Ti) that are, e.g., about 30 nm/300 nm/30 nm thick) can be deposited on a front side of the cleaned glass substrate 303. A negative photo resist (e.g., NR2-8000P) can then be spin coated on the front side of the glass substrate 303 and soft baking performed (e.g., at 120° C. for 10 minutes). After an exposure process using UV light (e.g., 365 nm), a post-exposure baking is performed (e.g., at 80° C. for 5 minutes). Developer RD6 can be used to remove the unexposed photo resist area, leaving a photoresist pattern.

A first metal layer can then be electroplated (e.g., copper that is, e.g., about 2 μm thick) on the front side of the glass substrate 303 and on the sides of the TGV 306. The remaining photo resist and seed layer can then be removed. Also, for the disc fabrication, a second metal layer (e.g., Ti) can be deposited on the front side and back side of the glass substrate 303. Negative photo resist (e.g., NR2-8000P) can be spin coated on the back side of the glass substrate 303 and soft baking performed (e.g., at 120° C. for 10 minutes), followed by post-exposure baking (e.g., at 80° C. for 5 minutes) after exposure process using UV light (e.g., 365 nm). The photo resist area that was unexposed to the UV light can be removed by developer RD6 and a third metal layer (e.g., copper that is, e.g., about 1 μm thick) can be sputtered on the back side of the glass substrate, followed by removal of the photo resist and second metal layer which leave the formed antenna 300a with TGV 306 and loading-disc 309.

Figure 3B:
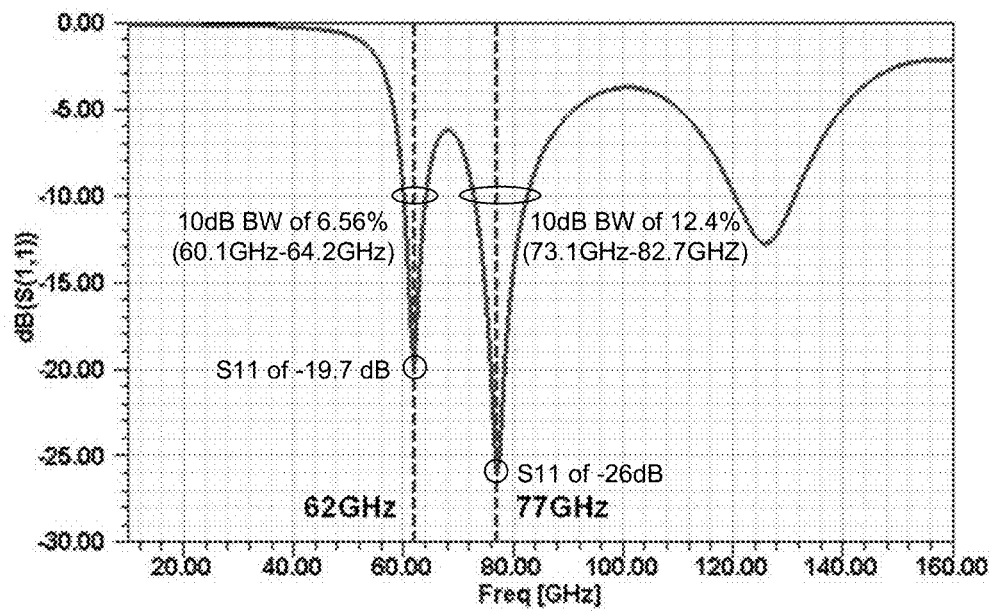
Figure 3C:
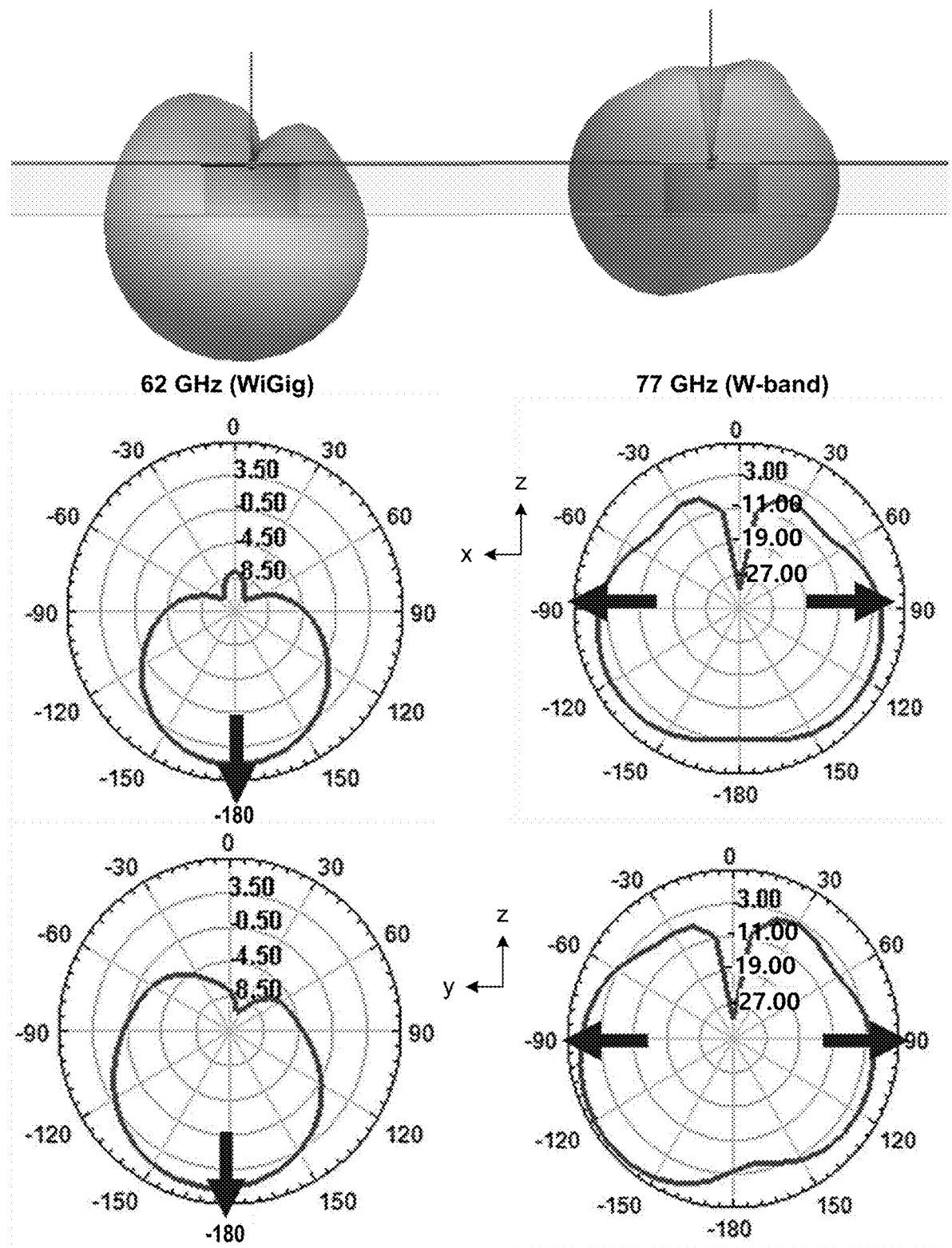

A dual mode TGV antenna 300a designed for 62 GHz (WiGig)/77 GHz (W-band) operation was simulated and the results presented in FIGS. 3B and 3C. FIG. 3B shows an example of a simulated return loss of the dual mode TGV antenna 300a implemented on a glass interposer 303. The S11 resonances occur at 62 and 77 GHz with a return loss of about 19.7 and 26 dB, respectively. The 10 dB bandwidth is 6.56% from 60.1 GHz to 64.2 GHz and 12.4% from 71.3 GHz to 82.7 GHz, respectively. As summarized in the table of FIG. 3B, a broad-side radiation pattern is produced when the dual mode TGV antenna 300a is excited at 62 GHz (with a simulated peak gain of 3.81 dBi and an antenna radiation efficiency of 93.3%) and an omni-directional radiation pattern is produced when the dual mode TGV antenna 300a is excited at 77 GHz (with a simulated peak gain of 2.58 dBi and an antenna radiation efficiency of 96.9%). FIG. 3C shows 3D polar plots (top) of the simulated radiation pattern and 2D polar plots in the XZ plane (middle) and YZ plane (bottom) at 62 and 77 GHz, left and right columns respectively. As indicated by the arrows in FIG. 3C, the radiation pattern at 62 GHz is focused downward along the z-axis, while the radiation pattern at 77 GHz is omni-directional in the x-y plane.

The characteristics of a TGV antenna 300 can be changed by varying its dimensions. Changing the ratio of the diameter (d1) of the TGV (or group of TVGs) 306 to the diameter (d2) of the disc 309 allows the three types of glass integrated antennas illustrated in the table of FIG. 2A to be produced. For example, a d1/d2 ratio of about 0.33 can result in the monopole mode being dominate, a d1/d2 ratio of about 0.7 can result in the patch mode being dominate, and a d1/d2 ratio of about 0.5 can result in the both modes occurring. A group of smaller TGVs 306 distributed in a circular pattern can replace a single larger TGV 306 as will be shown.

Figure 3D:
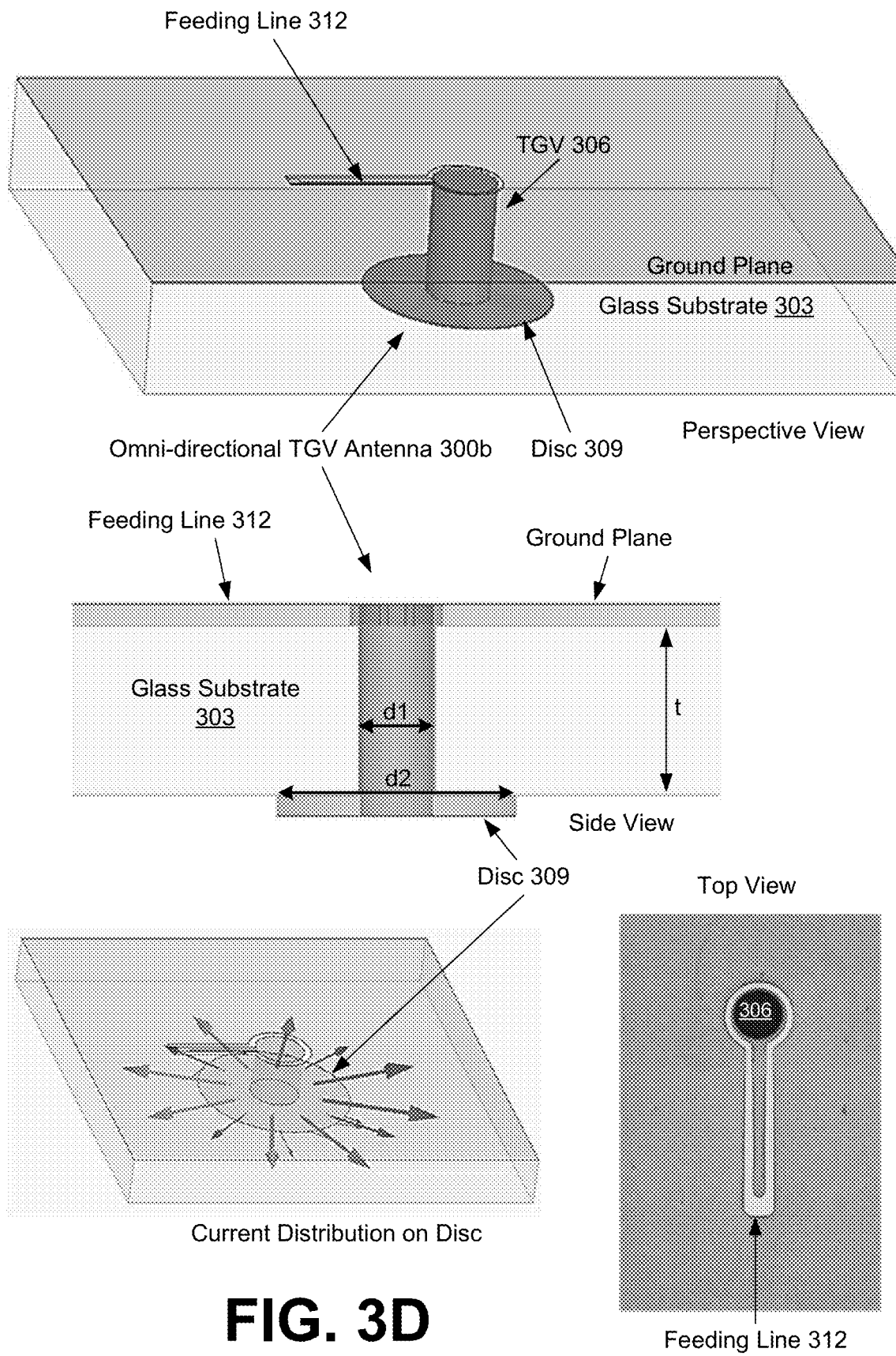
FIGS. 3D through 3F illustrate an example of a omni-directional TGV antenna and simulation/measurement results, in accordance with various embodiments of the present disclosure.

FIG. 3D illustrates the geometry of an example of an omni-directional TGV antenna 300b. In the example, the antenna 300b was designed on a glass substrate 303 with a relative electrical permittivity $\varepsilon_r$ of 5.53, a loss tangent tan δ of 0.003, and a thickness (t) of 400 μm. The capacitive disc 309 is loaded at the tip of the TGV 306 to make the antenna more efficient. In the example, the diameter (d1) of the TGV 306 working as the antenna 300b is 180 μm and a diameter (d2) of the disc 309 is 560 μm. A coplanar waveguide (CPW) feeding line 312 with a length of 710 μm can be used to excite the antenna 300b. The resulting current distribution on the disc 309 is illustrated by the radial arrows.

Figure 3E:
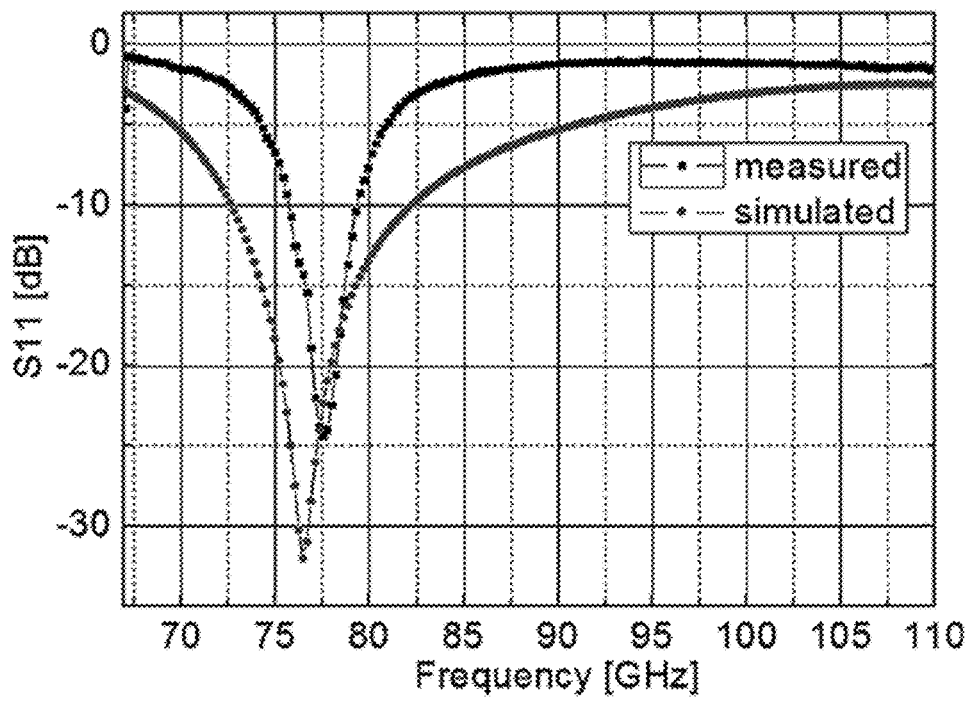
Figure 3F:
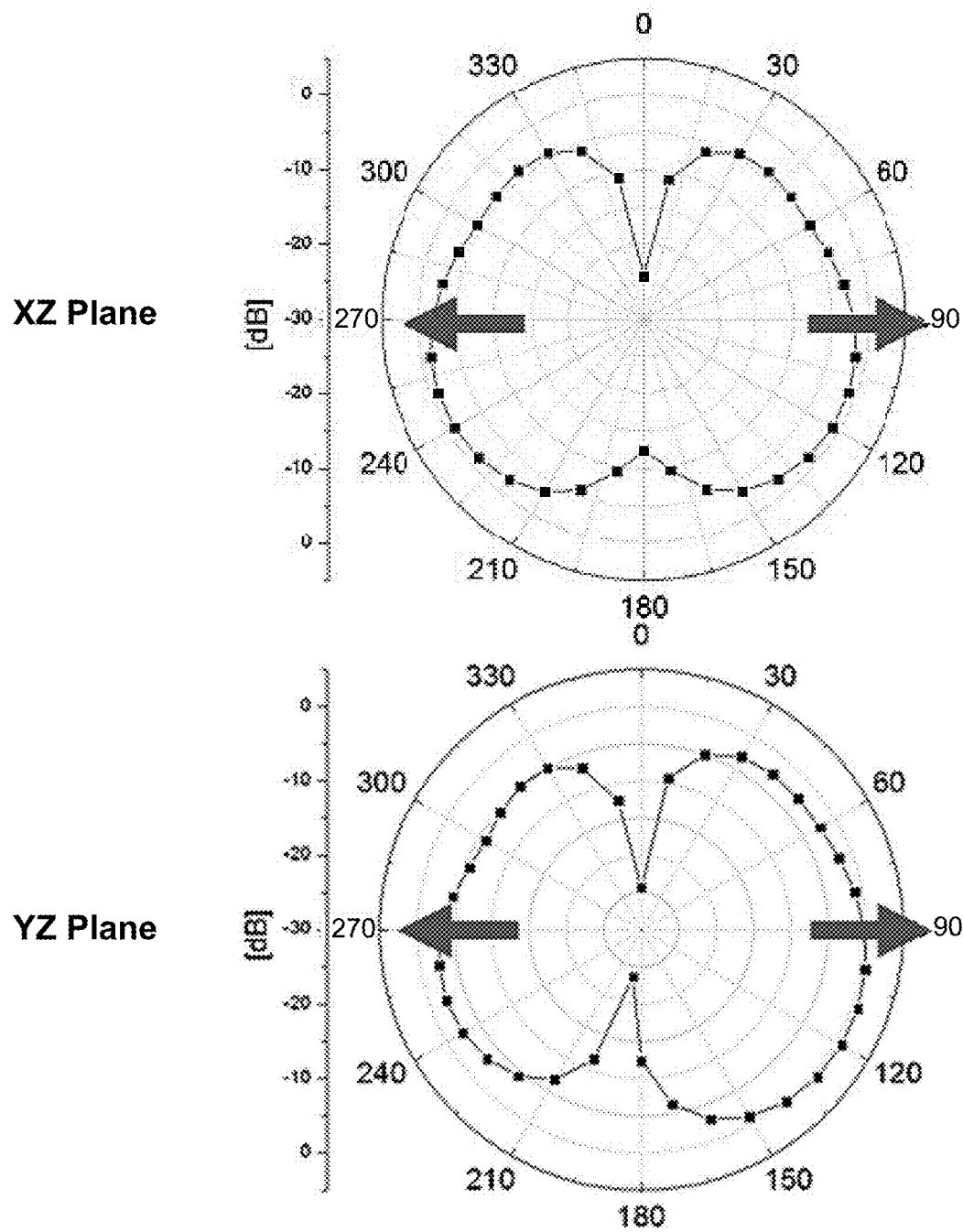

An omni-directional TGV antenna 300b designed for 77 GHz (W-band) operation was simulated and measured, and the results presented in FIGS. 3E and 3F. A vector network analyzer (e.g., HP E8361A, Agilent, Inc.) and a millimeter wave module (e.g., N5260-60003, Agilent, Inc.) were used to measure the return loss of the omni-directional TGV antenna 300b (with a probe, GSG, 150 μm pitch) after standard one port short-open-load (SOL) calibration between 67 GHz and 110 GHz. FIG. 3E shows an example of simulated and measured return loss of the omni-directional TGV antenna 300b. The S11 resonances occurred at 77 GHz with a return loss of about 28 and 20 dB, respectively. The 10 dB bandwidth were 12.4% from 72.9 GHz to 82.5 GHz for the simulation results and 4.8% from 75.7 GHz to 79.4 GHz for the measured results. FIG. 3F shows 2D polar plots in the XZ plane (top) and YZ plane (bottom) at 77 GHz. As indicated by the arrows in FIG. 3F, the radiation pattern at 77 GHz is omni-directional in the x-y plane.

Figure 3G:
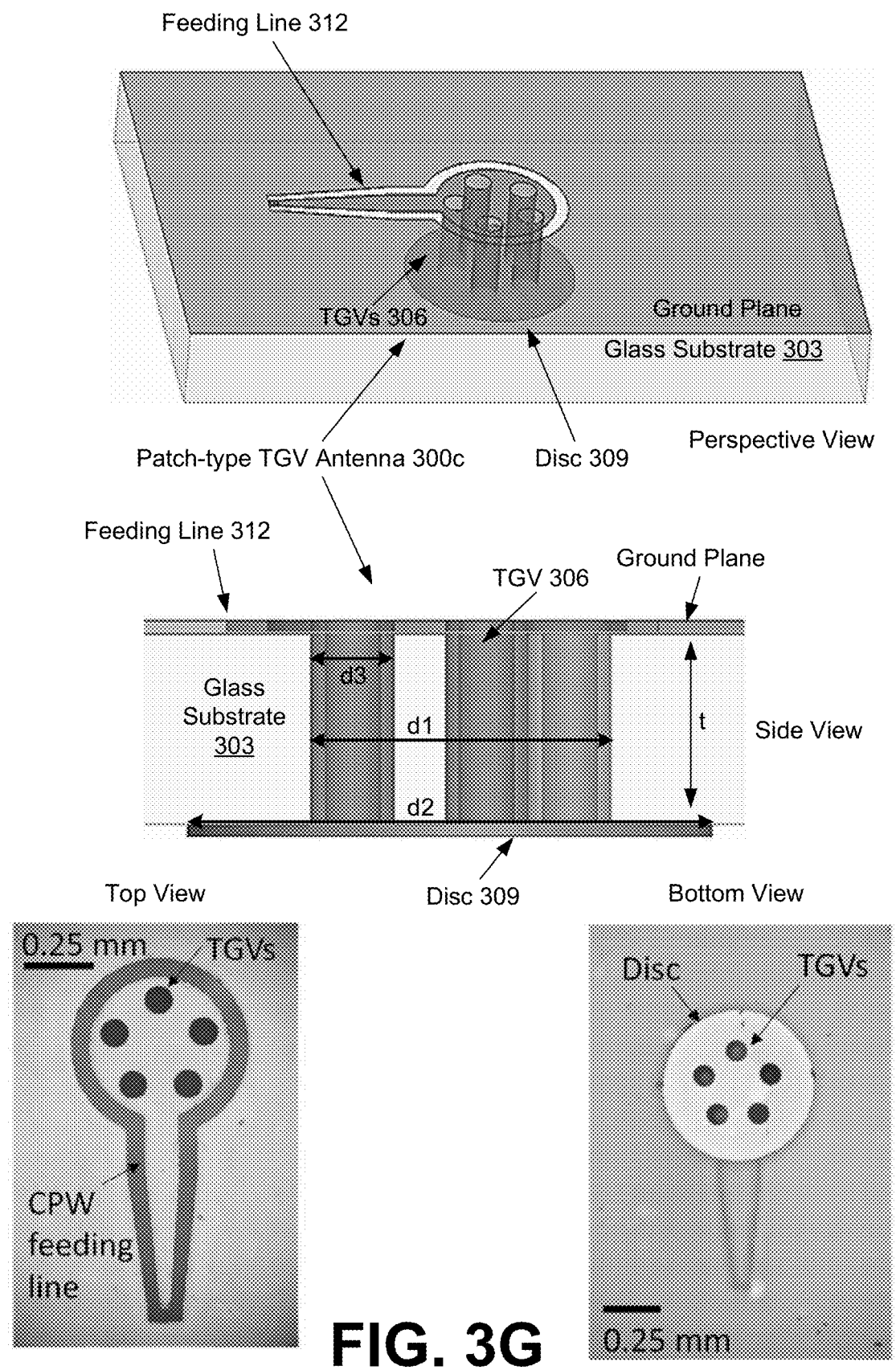
FIGS. 3G through 3I illustrate an example of a patch-type TGV antenna and simulation/measurement results, in accordance with various embodiments of the present disclosure.

FIG. 3G illustrates the geometry of an example of a patch-type TGV antenna 300c. In the example, the antenna 300c was designed on a glass substrate 303 with a thickness (t) of 300 μm. The capacitive disc 309 is loaded at the tips of five TGVs 306 to make the antenna more efficient. The TGVs are uniformly distributed in a circular pattern. In the example, the diameter (d1) of the group of TGVs 306 working as the antenna 300c is 520 μm and a diameter (d2) of the disc 309 is 740 μm. The individual TGVs have a diameter (d3) of 120 μm. A coplanar waveguide (CPW) feeding line 312 can be used to excite the antenna 300c. The two photo micrographs at the bottom of FIG. 3G show images of the micro fabricated disc-loaded patch antenna with five TVGs. Additional discussion is provided in "Millimeter-wave Wireless Intra-/Inter Chip Communications in 3D Integrated Circuits using Through Glass Via (TGV) Disc-loaded Patch Antennas" by S. Hwangbo et al., 2016 IEEE 66th Electronic Components and Technology Conference (ECTC), which is hereby incorporated by reference in its entirety.

Figure 3H:
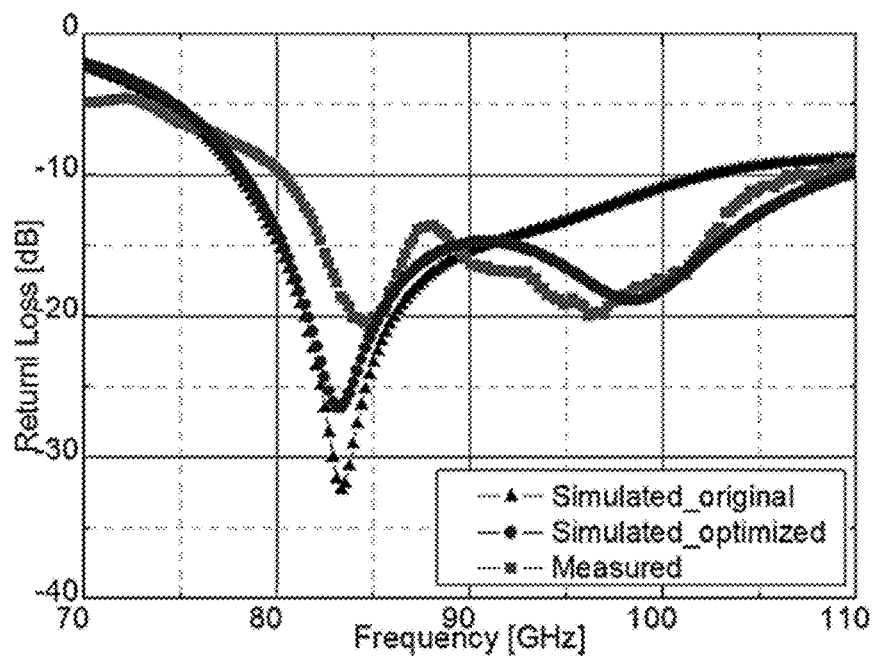
Figure 3I:
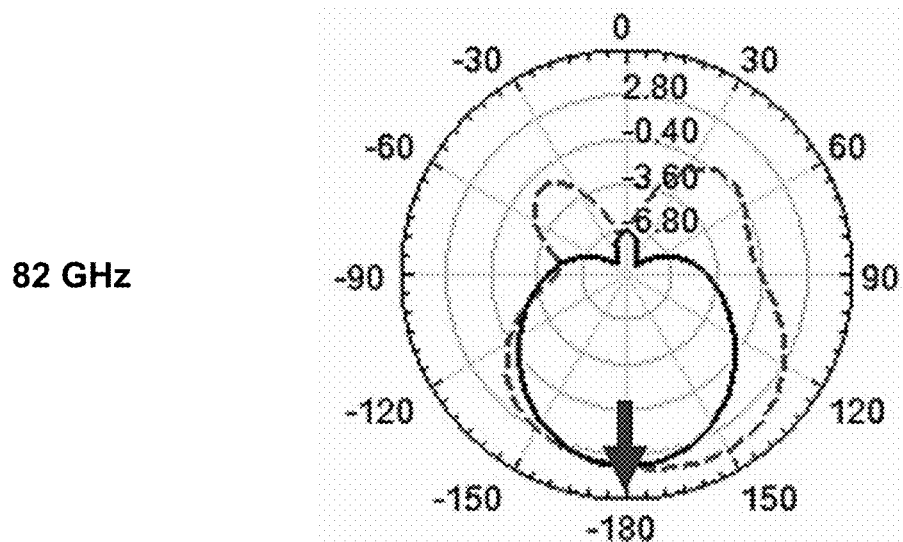
Figure 3I:
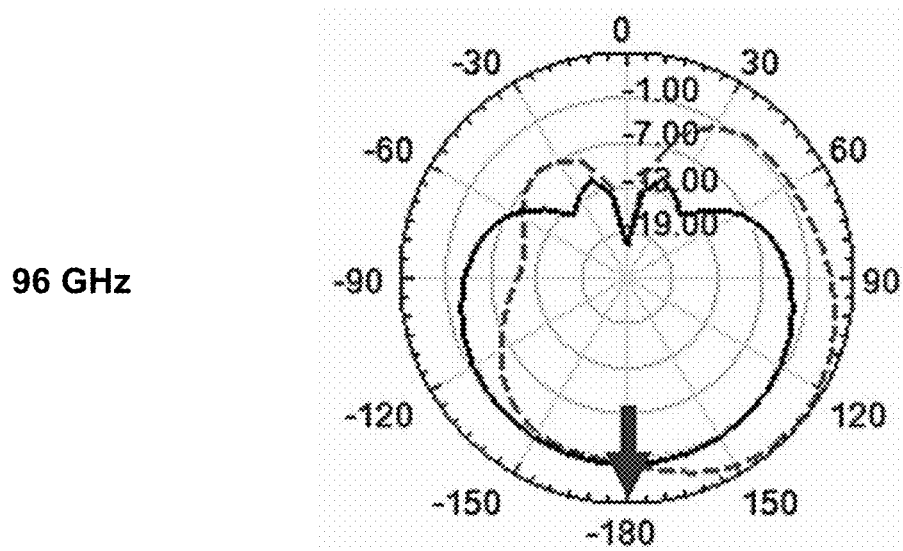

A patch-type TGV antenna 300c was simulated and measured, and the results presented in FIGS. 3H and 3I. FIG. 3H shows an example of simulated and measured return loss of the patch-type TGV antenna 300c. The simulated and measured S11 resonances occurred at about 84 GHz with a return loss of about 32.3 and 20.9 dB, respectively. The 10 dB bandwidth were 29.23% from 78.08 GHz to 102.44 GHz for the simulation results and 31.3% from 80.89 GHz to 107.06 GHz for the measured results. FIG. 3I shows the radiation patterns at 82 GHz (top) and 96 GHz (bottom). As indicated by the arrows in FIG. 3I, the radiation patterns are focused downward along the z-axis.

Figure 3J:
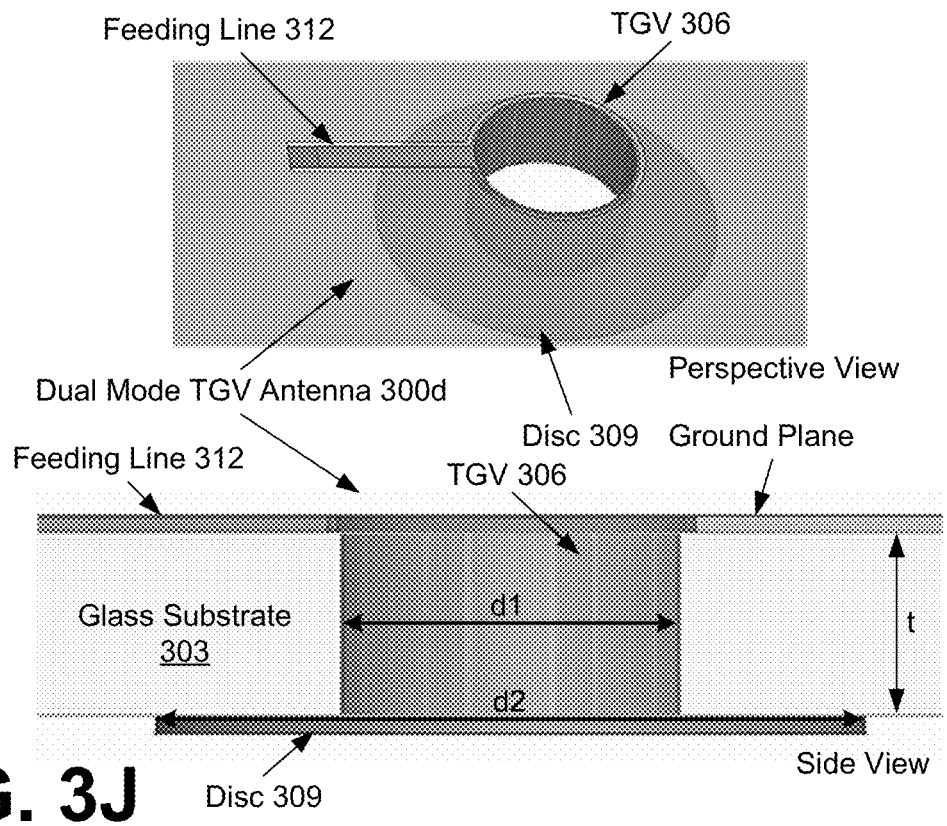
FIGS. 3J through 3P illustrate an example of another dual mode TGV antenna and simulation/measurement results, in accordance with various embodiments of the present disclosure.
Figure 3K:
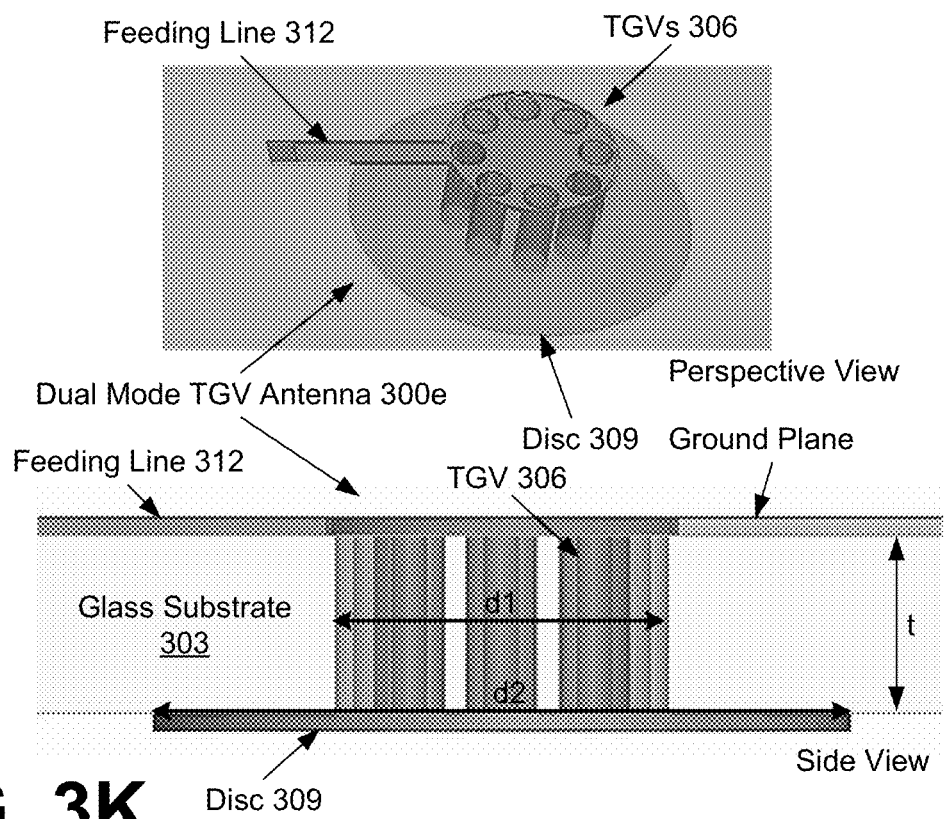

FIGS. 3J and 3K illustrate the geometry of examples of other dual mode TGV antennas 300d and 300e, respectively. In the examples, the antennas 300d and 300e were designed on a glass substrate 303 with a thickness (t) of 300 μm. In the example of FIG. 3J, the capacitive disc 309 is loaded at the tip of the TGV 306 to make the antenna more efficient. The diameter (d1) of the TGV 306 working as the antenna 300d is 580 μm and a diameter (d2) of the disc 309 is 1.176 mm. In the example of FIG. 3K, the single TGV of antenna 300d is replaced by a group of smaller TGVs 306. The capacitive disc 309 is loaded at the tips of eight TGVs 306, where the TGVs are uniformly distributed in a circular pattern. The diameter (d1) of the group of TGVs 306 working as the antenna 300e is 580 μm and a diameter (d2) of the disc 309 is 1.176 mm. The individual TGVs have a diameter (d3) of 120 μm and are separated from each other by 45 degrees about the center of the group. A coplanar waveguide (CPW) feeding line 312 can be used to excite the antennas 300d and 300e.

Figure 3L:
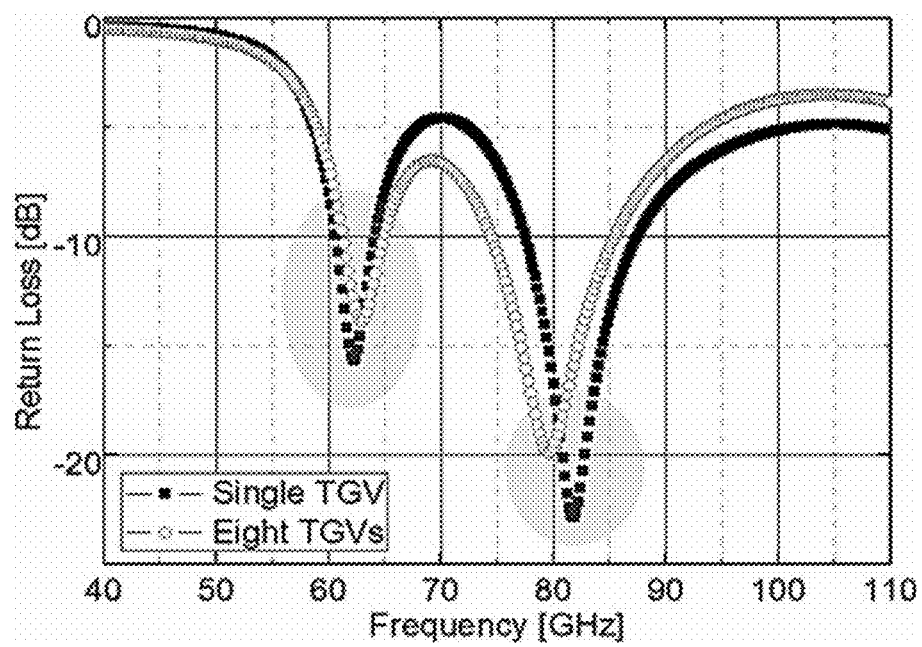
Figure 3M:
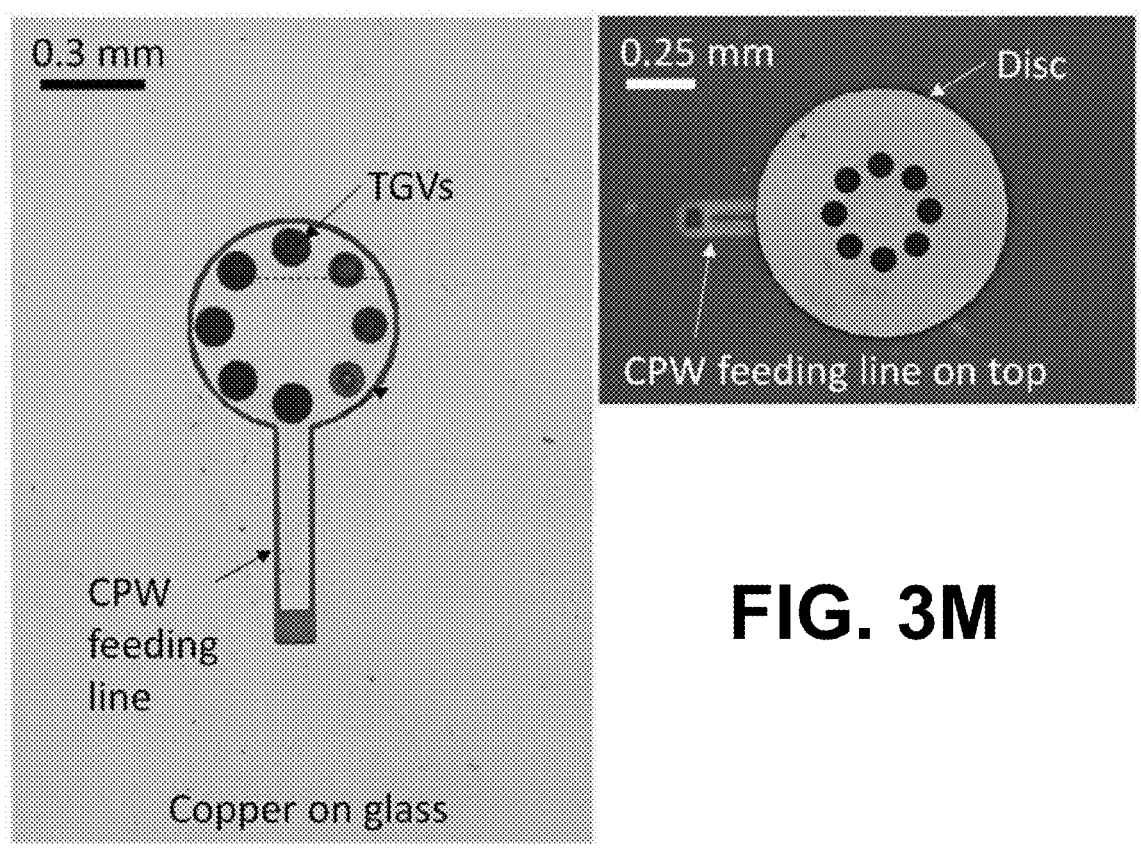

The dual mode TGV antennas 300d and 300e designed for 62 GHz (WiGig)/77 GHz (W-band) operation were simulated and a comparison of the return losses are presented in FIG. 3L. The disc 309 works as a patch antenna at 62 GHz and the TGV or TGVs 306 work as a monopole antenna at 77 GHz with similar results for both antennas 300d and 300e. The photo micrographs of FIG. 3M show images of the micro fabricated dual mode (or band) antenna 300e with eight TVGs.

Figure 3N:
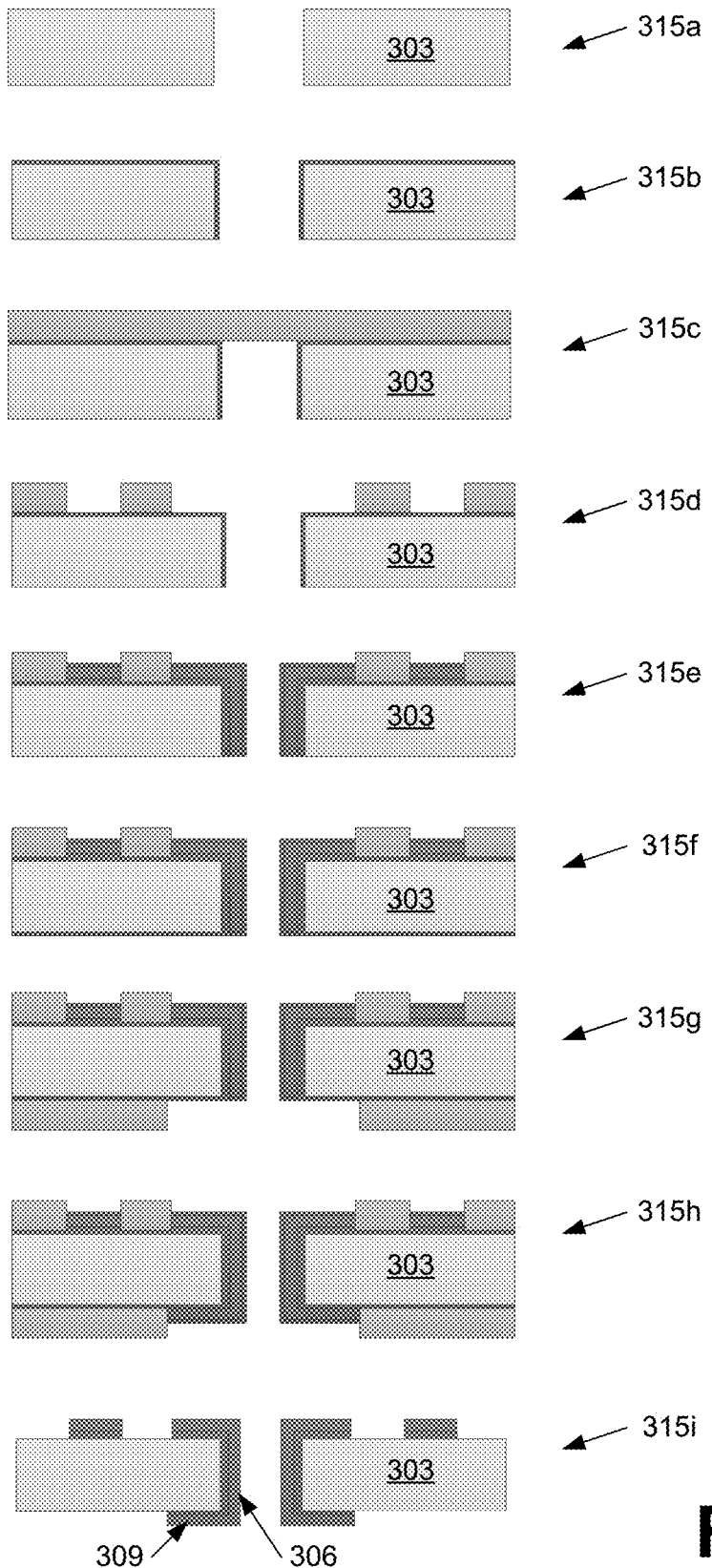

Referring to FIG. 3N, shown is another example of the fabrication of a dual mode TGV antenna 300d or 300e. To begin, a glass substrate 303 processed by fusion forming by Corning Inc. can be provided and cleaned at 315a. The fusion formed glass substrate 303 is thin and strong and has high quality of pristine surface. The micro fabrication of the antenna 300d/300e on the glass substrate 303 can be divided into two processing stages: (1) the front side of the glass substrate 303 and via fabrication processing for the CPW feeding line 312 and TGV 306; and (2) the back side of the glass substrate fabrication process for a circular disc 309. The TGV 306 can be formed in the glass substrate 303 using several techniques such as, e.g., mechanical (drill), chemical (wet chemical and plasma), electrical discharge and/or laser drilling. In order to fabricate the feeding line 312 and TGV 306, an adhesion layer (e.g., titanium (Ti) about 30 nm thick) can be deposited on a front side of the cleaned glass substrate 303 at 315b. A negative photo resist (e.g., NR9-8000P about 10 μm thick) can then be spin coated on the front side of the glass substrate 303 at 315c and soft baking performed. After an exposure process using UV light (e.g., 250 mW/cm$^2$) at 315d, a post-exposure baking can be performed. Developer RD6 can be used to remove the unexposed photo resist area, leaving a photoresist pattern as illustrated at 315d.

At 315e, a metal layer can be sputtered (e.g., titanium (Ti)/copper (Cu)/titanium (Ti) that are, e.g., about 30 nm/2 μm/30 nm thick) on the front side of the glass substrate 303 and on the sides of the TGV 306. An adhesion layer (e.g., titanium (Ti) about 30 nm thick) can then be deposited on a back side of the glass substrate 303 at 315f. Lamination of a dry film (e.g., MX5020 about 20 μm thick) on the back side can be applied at 315g, with UV exposure (e.g., 100 mW/cm$^2$) and development. At 315h, a metal layer can be sputtered (e.g., titanium (Ti)/copper (Cu)/titanium (Ti) that are, e.g., about 30 nm/2 μm/30 nm thick) on the back side of the glass substrate 303. Removal of the dry film and/or photo resist, Ti etching and cleaning at 315i leaves the formed antenna 300d/300e with TGV(s) 306 and loading-disc 309.

Figure 3O:
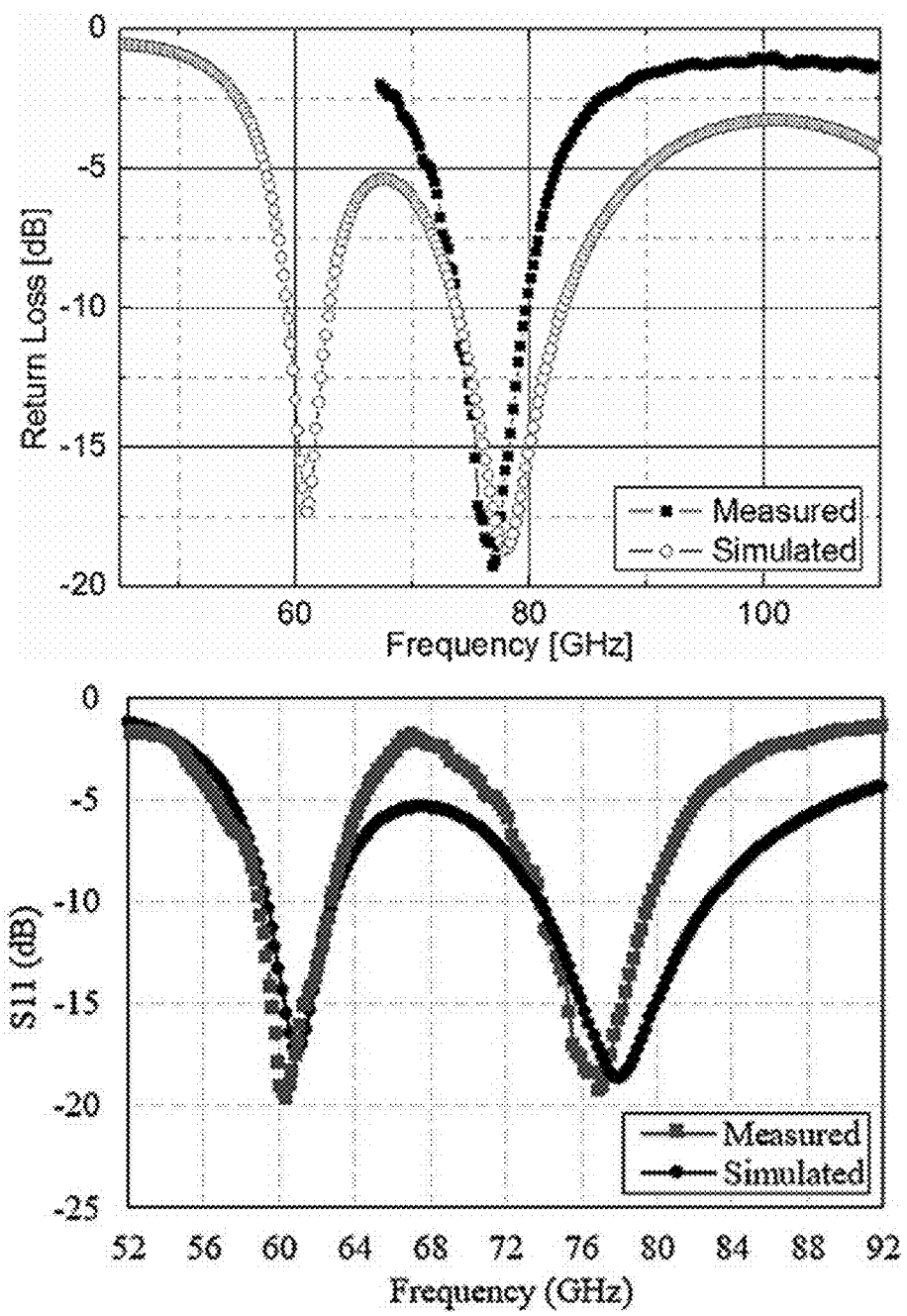
Figure 3P:
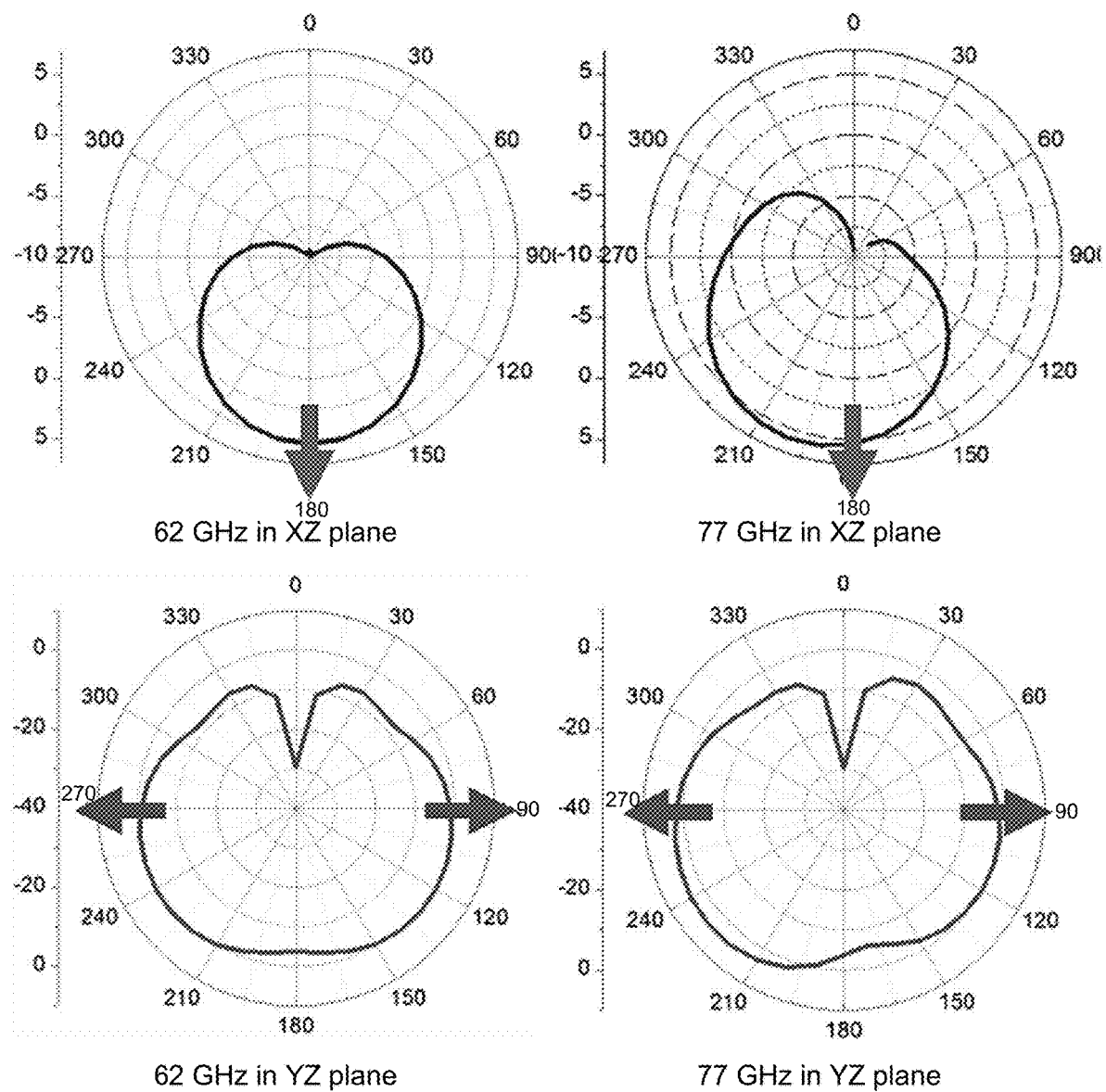

The dual mode TGV antenna 300e designed for 62 GHz (WiGig)/77 GHz (W-band) operation was simulated and measured, and the results presented in FIGS. 3O and 3P. FIG. 3O shows examples of simulated and measured return loss of the dual band TGV antenna 300e in a range from 45 GHz to 110 GHz and from 52 GHZ to 92 GHz. The simulated S11 resonances occurred at 62 GHz and 78 GHz with a return loss of about 17.3 and 18 dB, respectively. The measured resonance occurred at 77 GHz with a return loss of about 20 dB. The 10 dB bandwidth were 6% from 59.3 GHz to 63 GHz and 12% from 73.7 GHz to 83 GHz for the simulation results and 8.05% from 73.7 GHz to 80 GHz for the measured results. FIG. 3P shows the radiation patterns at 62 GHz (left) and 77 GHz (right) in the XZ plane (φ=0°) and YZ plane (φ=90°). The arrows indicate the focus of the radiation patterns. FIG. 3Q provides a table comparing the operational characteristics of the omni-directional TGV antenna 300b, the patch-type TGV antenna 300c, and the dual mode TGV antenna 300e.

Figure 3R:
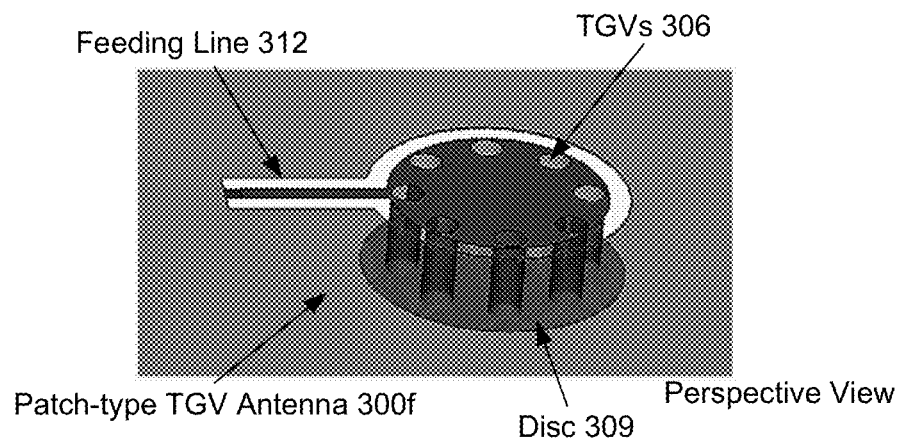
FIG. 3R illustrates the effects of variation of TGV design parameters on operation of the dual mode TGV antenna of FIG. 3K, in accordance with various embodiments of the present disclosure.
Figure 3R:
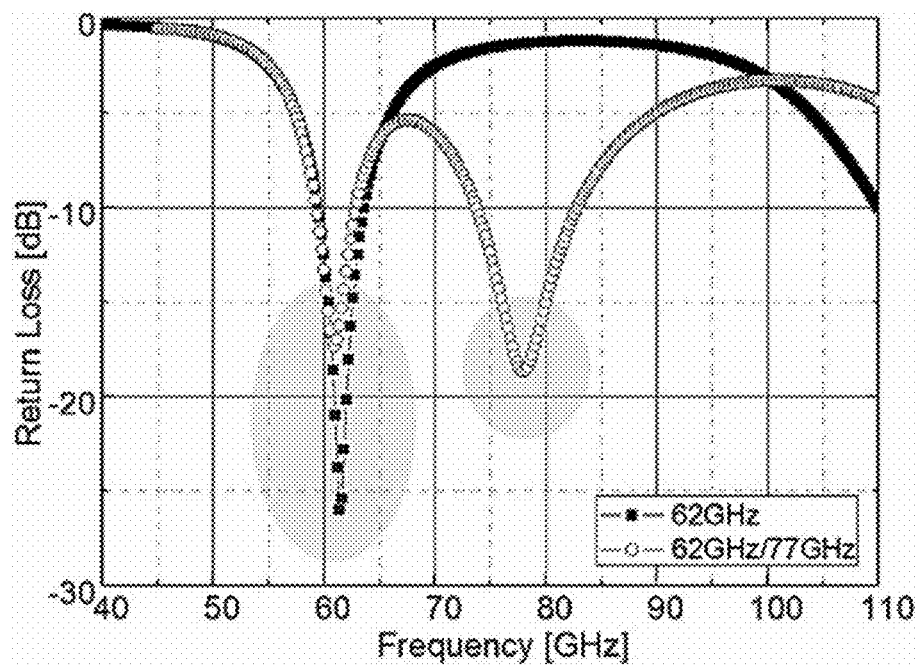

FIG. 3R illustrates the effect of increasing the diameter (d1) of the TGVs 306 in the antenna 300e in FIG. 3K. By increasing the ratio of d1 to d2, the TGV antenna design becomes a patch-type TGV antenna 300f. As can be seen in FIG. 3R, the eight TGVs 306 are evenly distributed in the circular pattern, but at a larger diameter than for antenna 300e. The comparison of the return losses in FIG. 3R shows that while the disc 309 of antenna 300f continues to work as a patch antenna with a response at 62 GHz, the antenna 300f no longer exhibits a monopole antenna response at 77 GHz.

Figure 4A:
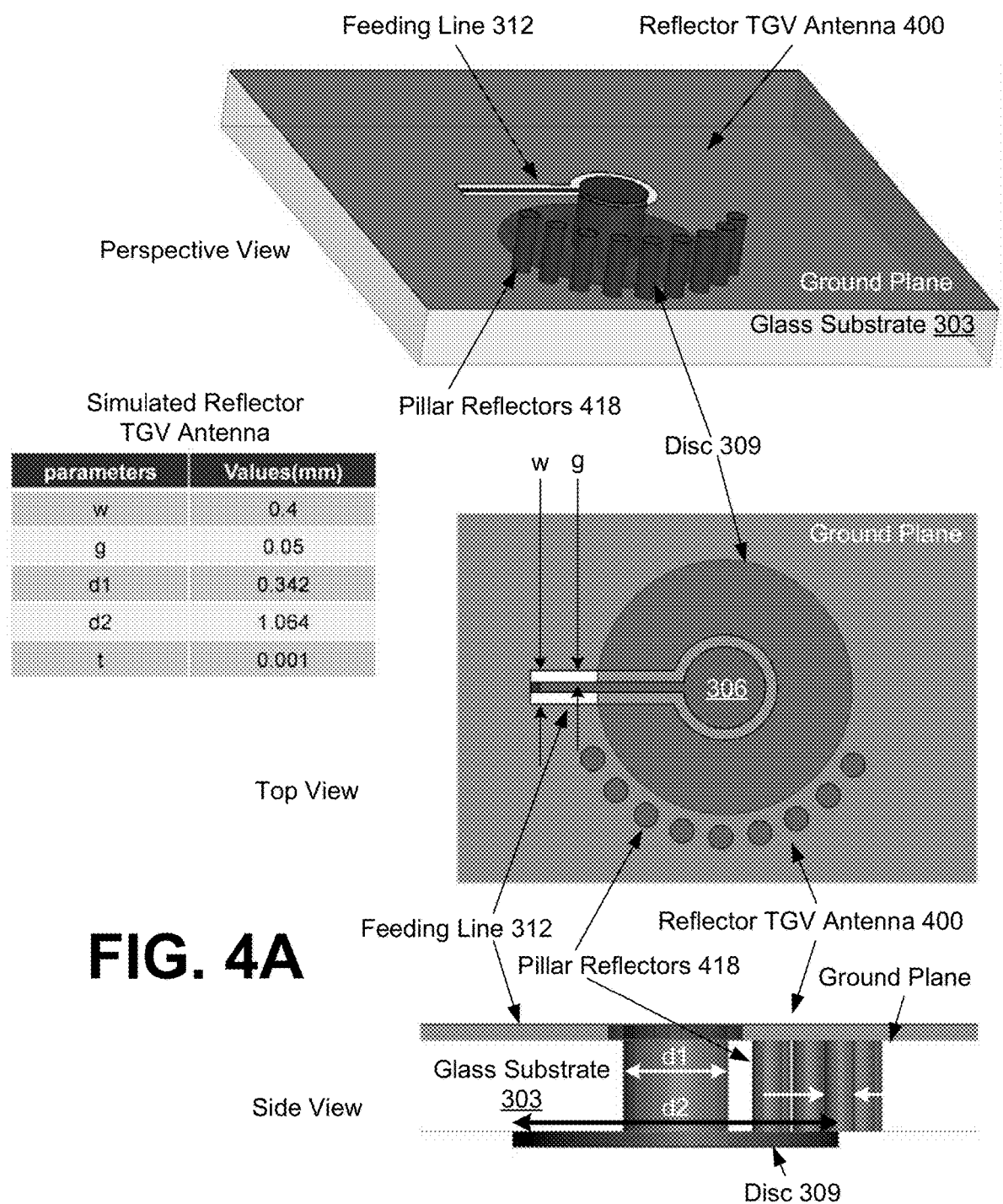
FIGS. 4A through 4C illustrate an example of a reflector TGV antenna and simulation results, in accordance with various embodiments of the present disclosure.

Referring next to FIG. 4A, shown are perspective, top and side views of an example of a reflector TGV antenna 400 on a glass interposer layer 303. The TGV 306 loaded with a circular disc 309 can be integrated on the glass interposer layer 303 for millimeter-wave wireless communication applications. The TGV 306 can be used as the main radiator and the circular disc 309 can be used for impedance matching. An omnidirectional radiation pattern formed by the monopole antenna allows in-plane wireless communication, which can solve problems such as cross talk and time delay caused by the conventional wire bonding approach.

FIG. 4A illustrates the geometry of an example of the reflector TGV antenna 400, which is consistent with the dual mode TGV antenna 300a. In the example, the antenna 400 was designed on a glass substrate 303 with a relative electrical permittivity $\varepsilon_r$ of 5.53, a loss tangent tan δ of 0.0036, and a thickness (t) of 300 μm. The capacitive disc 309 is loaded at the tip of the TGV 306 to make the antenna more efficient. In the example, the diameter (d1) of the TGV 306 working as the antenna 300a is 342 μm and a diameter (d2) of the disc 309 is 1.064 mm. A coplanar waveguide (CPW) feeding line 312 is used to excite the antenna 300a. Dimensions of the CPW feeding line 312 are w=0.4 mm and g=0.05 mm. In addition, the reflector TGV antenna 400 includes an array of pillars 418 surrounding a portion of the TGV 306 and disc 309. In the example of FIG. 4A, nine TGVs are formed in the glass substrate 303 in a semicircular pattern around the outer edge of the disc 309 and filled with a reflective material. For instance, the pillars 418 may be formed by filling the TGVs with copper which is in contact with the ground plane. The reflector TGV antenna 400 was designed and simulated using the HFSS (ANSYS Inc.). In the simulated reflector TGV antenna 400, the array of pillars 418 includes nine pillars with a diameter of 0.1 mm distributed about the outer edge of the disc 309 in an arc or semi-circle of about 120 degrees. The size, number, distance from the outer edge of the disc, shape and angular spread of the pillar array 418 may be varied to achieve certain characteristics.

Figure 4B:
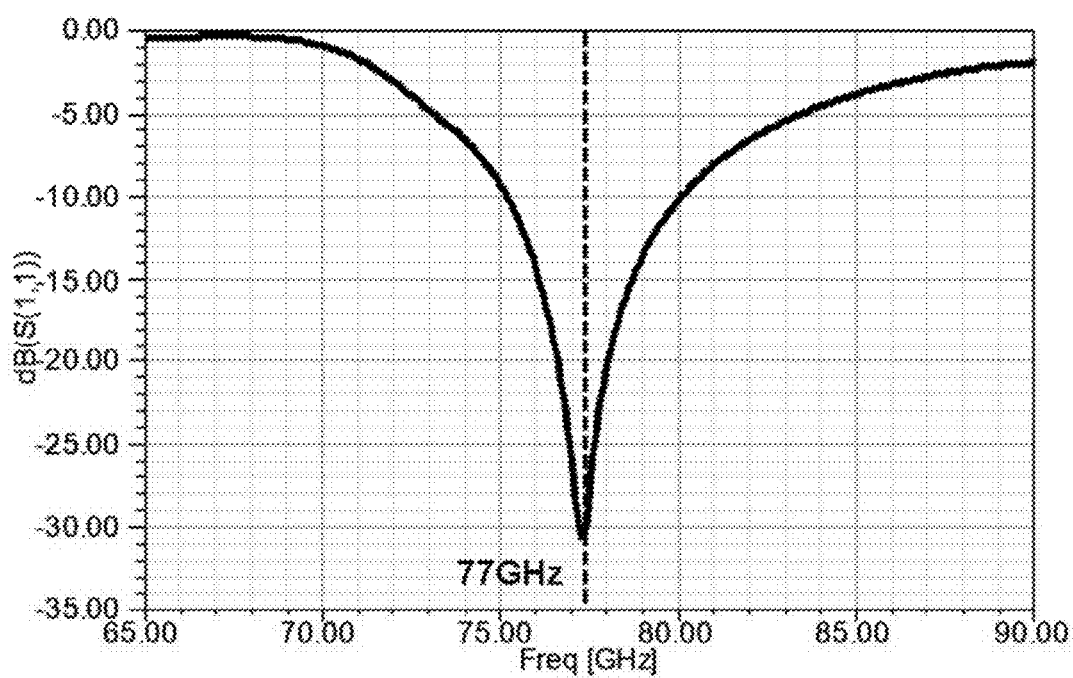
Figure 4C:
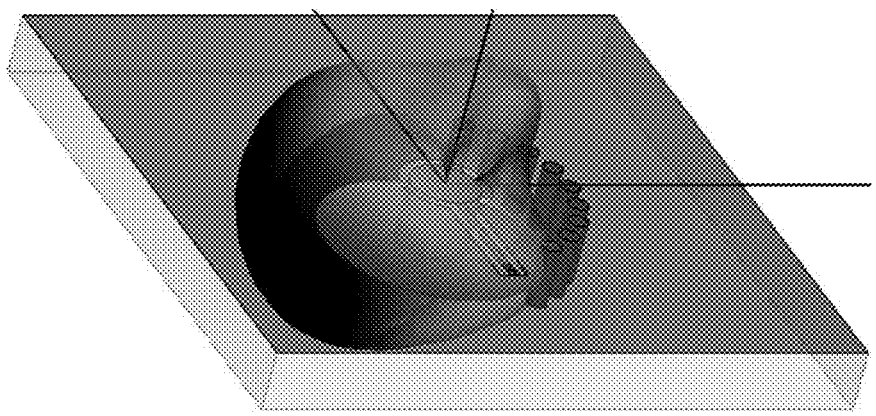
Figure 4C:
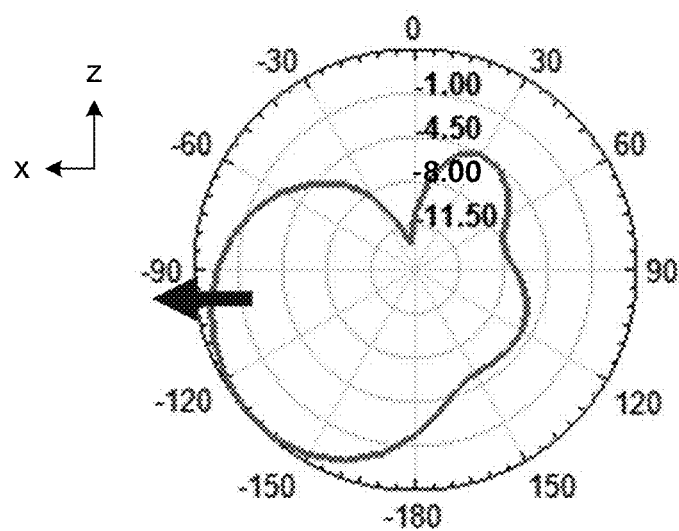
Figure 4C:
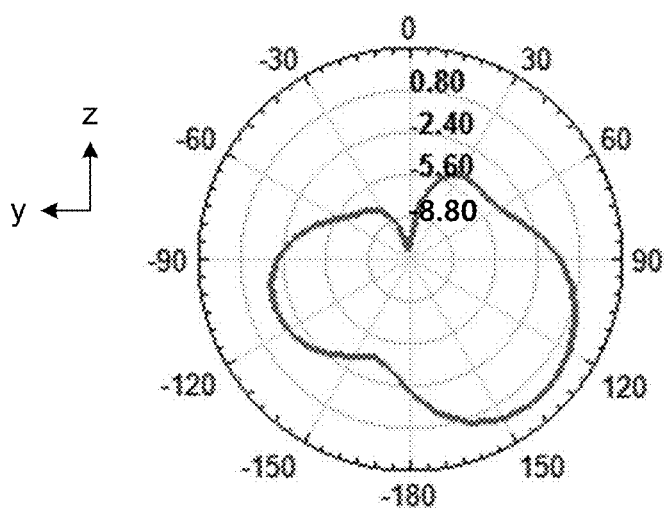

A reflector TGV antenna 400 designed for 77 GHz operation was simulated and the results presented in FIGS. 4B and 4C. FIG. 4B shows an example of a simulated return loss of the reflector TGV antenna 400 implemented on a glass interposer 303. The S11 resonance occurs at 77 GHz with a return loss of about 31 dB. An omni-directional radiation pattern is produced, with a portion being reflected by the pillar array to direct and focus the radiation excited at 77 GHz. A simulated peak gain of 1.8 dBi and an antenna radiation efficiency of 93% was achieved. FIG. 4C shows a 3D polar plot (top) of the simulated radiation pattern and 2D polar plots in the XZ plane (middle) and YZ plane (bottom) at 77 GHz. As indicated by the arrow in FIG. 4C, the radiation pattern at 77 GHz is focused in one direction of the x-y plane.

Figure 4D:
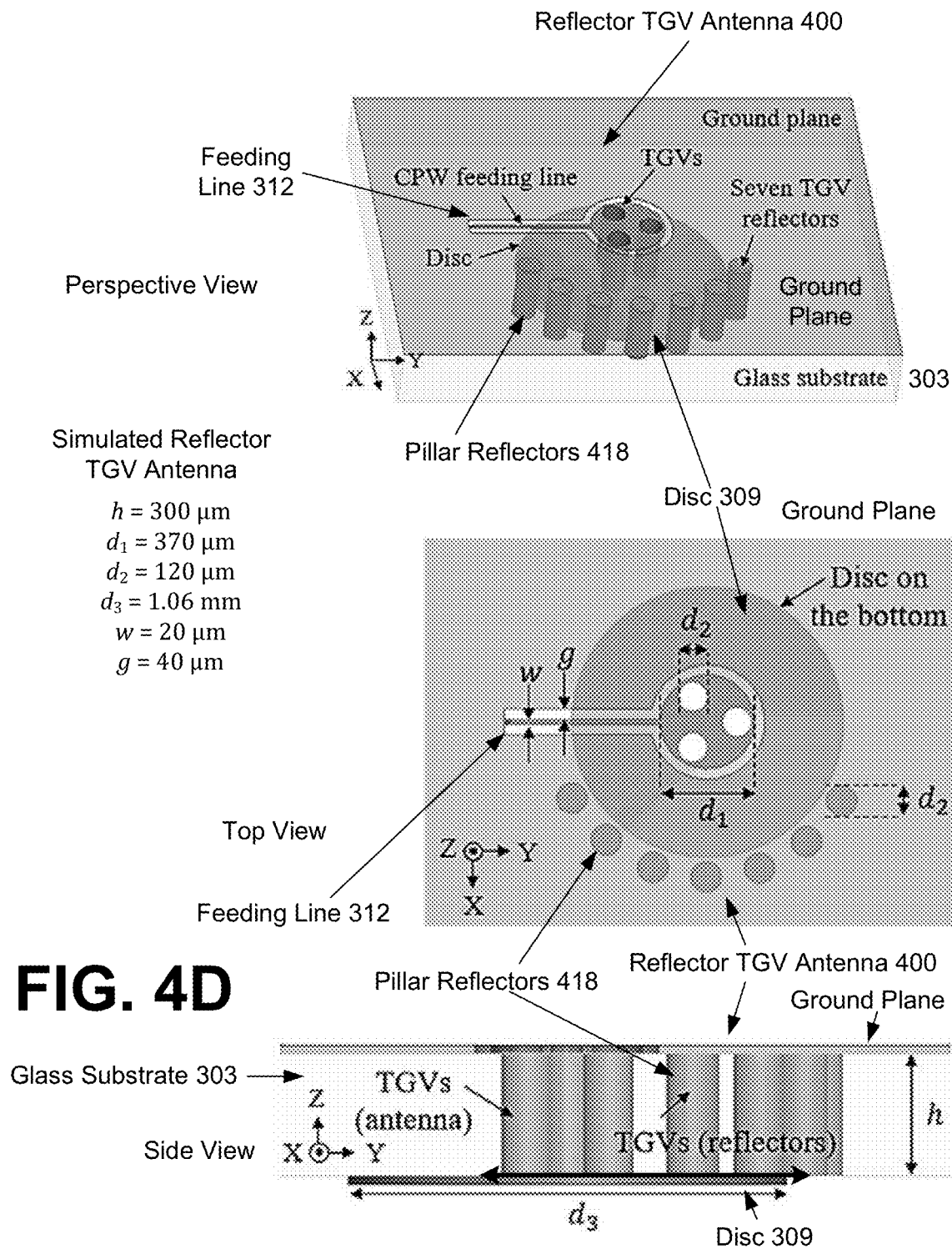
FIGS. 4D through 4G illustrate another example of a reflector TGV antenna and simulation results, in accordance with various embodiments of the present disclosure.

Referring next to FIG. 4D, shown are perspective, top and side views of another example of a reflector TGV antenna 400 on a glass interposer layer 303. A group of TGVs 306 loaded with a circular disc 309 can be integrated on the glass interposer layer 303 for millimeter-wave wireless communication applications. The group of TGVs 306 can be used as the main radiator and the circular disc 309 can be used for impedance matching. An omnidirectional radiation pattern formed by the monopole antenna allows in-plane wireless communication, which can solve problems such as cross talk and time delay caused by the conventional wire bonding approach.

FIG. 4D illustrates the geometry of the other example of the reflector TGV antenna 400. In the example, the antenna 400 was designed on the glass substrate 303 with a thickness (t) of 300 μm. The capacitive disc 309 is loaded at the tip of the group of TGVs 306 to make the antenna more efficient. In the example, the diameter ($d_1$) of the ring formed by the CPW feeding line 312 is 370 μm, a diameter ($d_2$) of the three TVGs 306 in the group is 120 μm and a diameter ($d_3$) of the disc 309 is 1.06 mm. The coplanar waveguide (CPW) feeding line 312 is used to excite the antenna. Dimensions of the CPW feeding line 312 are w=0.02 mm and g=0.04 mm. In addition, the reflector TGV antenna 400 includes an array of pillars 418 surrounding a portion of the TGV 306 and disc 309. In the example of FIG. 4D, seven TGVs are formed in the glass substrate 303 in a semicircular pattern around the outer edge of the disc 309 and filled with a reflective material. The array of pillars 418 includes seven pillars with a diameter ($d_2$) of 120 μm distributed in an arc or semi-circle of about 120 degrees. For instance, the pillars 418 may be formed by filling the TGVs with copper which is in contact with the ground plane. The size, number, distance from the outer edge of the disc, shape and angular spread of the pillar array 418 may be varied to achieve certain characteristics.

Figure 4E:
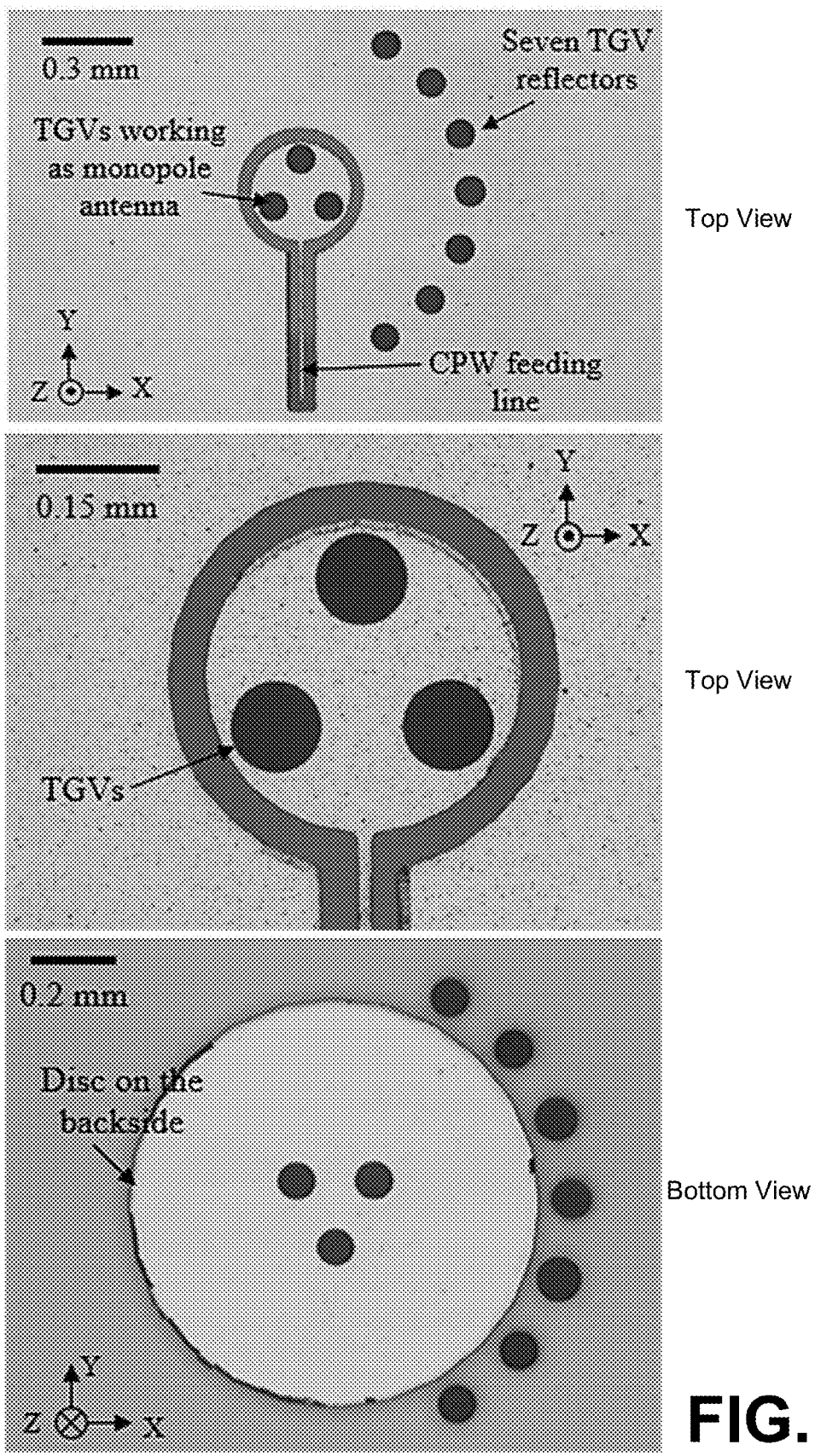
Figure 4F:
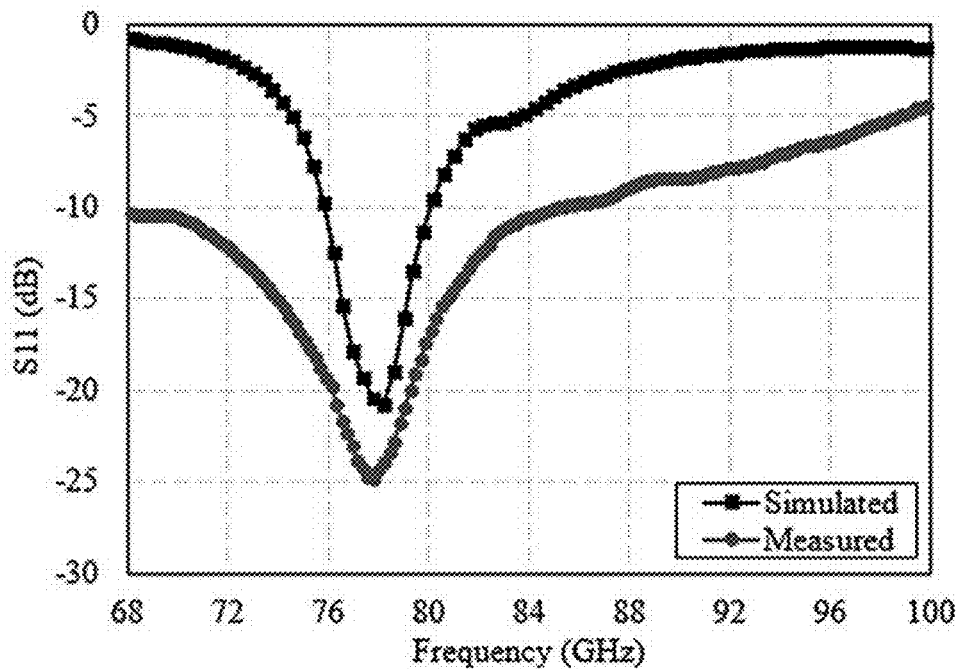
Figure 4G:
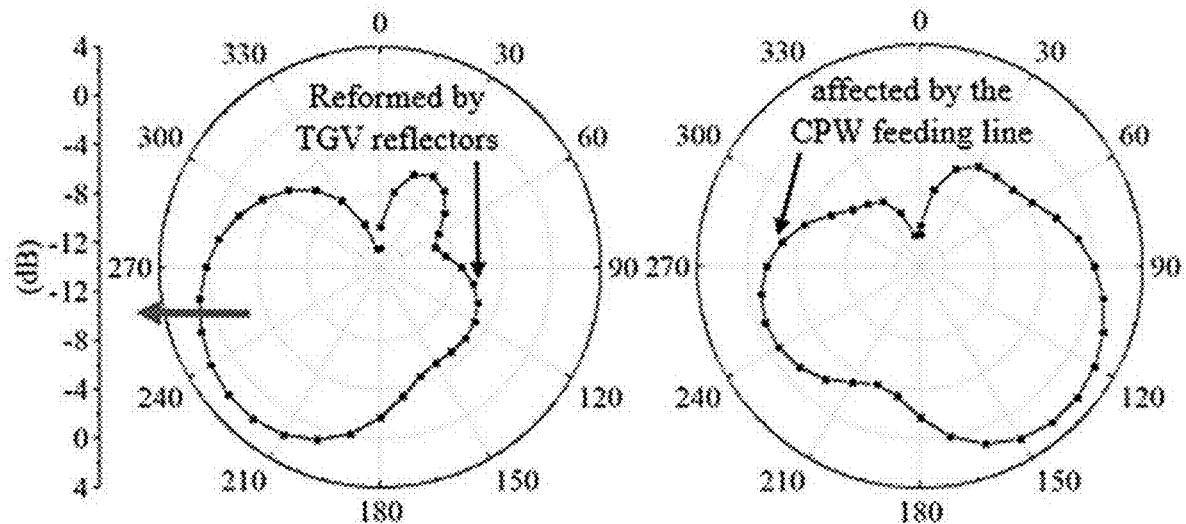

A reflector TGV antenna 400 designed for 77 GHz operation was simulated and fabricated for testing. Photomicrographs of the top and bottom of the micro-fabricated antenna are shown in FIG. 4E, with measurement and simulation results presented in FIGS. 4F and 4G. FIG. 4F shows a comparison a simulated return loss of the reflector TGV antenna 400 implemented on a glass interposer 303 and the measured return loss. FIG. 4G shows 2D polar plots of the simulated radiation pattern in the XZ plane (left) and YZ plane (right). As indicated by the arrow in FIG. 4G, the radiation pattern is focused in one direction of the x-y plane. The table in FIG. 4G summarizes the simulated performance of the TGV antenna.

An array of reflector TGV antennas 400 may be distributed in a 3D-IC to allow for directional control of transmissions by the array. For example, a line of reflector TGV antennas 400 can extend along one side of the 3D-IC. Depending upon the directional orientation of the reflector TGV antennas 400 in the array, intra-chip transmissions can be directed toward other antennas located within the 3D-IC or inter-chip transmissions can be directed to antennas located on other 3D-ICs. By controlling the excitation phase of the array of reflector TGV antennas 400, it would be possible to direct the transmissions toward specific antennas while avoiding other antennas. For instance, one set of transmissions can be directed to a first 3D-IC without sending the information to a second 3D-IC. A second set of transmissions can then be directed to the second 3D-IC, while avoiding the first 3D-IC. In this way, transmissions can be physically directed to the appropriate receiving device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about y".

Therefore, at least the following is claimed:

1. A reflector through-glass via (TGV) antenna, comprising:
a TGV extending through a glass substrate, the TGV comprising a metal core extending from a feeding line disposed on a first side of the glass substrate to a loading disc disposed on a second side of the glass substrate; and
an array of reflector pillars extending through the glass substrate from a ground plane on the first side of the glass substrate to the second side of the glass substrate, the array of reflector pillars distributed beyond an outer edge of the loading disc.

2. The reflector TGV antenna of claim 1, wherein the array of reflector pillars are distributed about the outer edge of the loading disc.

3. The reflector TGV antenna of claim 2, wherein the array of reflector pillars are distributed in a semi-circular or parabolic pattern about the outer edge of the loading disc.

4. The reflector TGV antenna of claim 2, wherein the array of reflector pillars are evenly spaced about the outer edge of the loading disc.

5. The reflector TGV antenna of claim 4, wherein adjacent pillars of the array of reflector pillars are separated by a distance less than a diameter of the adjacent pillars.

6. The reflector TGV antenna of claim 1, wherein individual pillars of the array of reflector pillars have a diameter of about 0.1 mm.

7. The reflector TGV antenna of claim 1, wherein the TGV has a diameter of about 0.342 mm and the loading-disc has a diameter of about 1.064 mm.

8. A three-dimensional integrated circuit (3D-IC), comprising a reflector TGV antenna of claim 1.

9. The 3D-IC of claim 8, wherein the reflector TGV antenna is configured for intra-chip communications.

10. The 3D-IC of claim 8, wherein the reflector TGV antenna is configured for inter-chip communications with a second 3D-IC.

11. The 3D-IC of claim 10, comprising an array of reflector TGV antennas aligned along a side of the 3D-IC, the array of reflector TGV antennas configured to direct inter-chip communications to the second 3D-IC.

12. A method, comprising:
exciting a dual mode through-glass via (TGV) antenna at a first frequency, the dual mode TGV antenna comprising a TGV extending through a glass substrate, the TGV comprising a metal core extending from a feeding line disposed on a first side of the glass substrate to a loading disc disposed on a second side of the glass substrate, the excitation at the first frequency generating an omni-directional radiation pattern about the dual mode TGV antenna; and exciting the dual mode TGV antenna at a second frequency, the excitation at the second frequency generating a broadside radiation pattern extending outward along an axial length of the dual mode TGV antenna.

13. The method of claim 12, wherein the dual mode TGV antenna is simultaneously excited at the first and second frequencies.

14. The method of claim 12 wherein the glass substrate is a glass interposer in a three-dimensional integrated circuit (3D-IC).

15. The method of claim 14, wherein the dual mode TGV antenna laterally transmits a first set of data within the 3D-IC at the first frequency and vertically transmits a second set of data within the 3D-IC at the second frequency.

16. The method of claim 12, wherein the dual mode TGV antenna comprises a group of TGVs extending through the glass substrate between the feeding line and the loading disc, the group of TGVs evenly distributed in a circular pattern.

* * * * *